United States Patent
Sashida

(10) Patent No.: US 9,373,626 B2
(45) Date of Patent: Jun. 21, 2016

(54) SEMICONDUCTOR DEVICE AND METHOD OF MANUFACTURING THE SAME

(71) Applicant: FUJITSU SEMICONDUCTOR LIMITED, Yokohama-shi, Kanagawa (JP)

(72) Inventor: Naoya Sashida, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/601,499

(22) Filed: Jan. 21, 2015

(65) Prior Publication Data

US 2015/0221657 A1 Aug. 6, 2015

(30) Foreign Application Priority Data

Feb. 5, 2014 (JP) ................. 2014-020552

(51) Int. Cl.
*H01L 27/108* (2006.01)
*H01L 29/76* (2006.01)
*H01L 27/115* (2006.01)
*G11C 11/22* (2006.01)

(52) U.S. Cl.
CPC ........ *H01L 27/11507* (2013.01); *G11C 11/221* (2013.01)

(58) Field of Classification Search
CPC ............ H01L 27/108; H01L 27/10855; H01L 27/10885; H01L 27/10852; H01L 27/11526; H01L 27/11529
USPC .................................. 257/296, 532
See application file for complete search history.

(56) References Cited

U.S. PATENT DOCUMENTS

| 2004/0124455 | A1 | 7/2004 | Lee et al. |
| 2004/0169202 | A1 | 9/2004 | Kang et al. |
| 2004/0173829 | A1 | 9/2004 | Kim |
| 2005/0244988 | A1* | 11/2005 | Wang et al. ............ 438/3 |
| 2012/0220057 | A1 | 8/2012 | Wang |

FOREIGN PATENT DOCUMENTS

JP 3-256358 A 11/1991

OTHER PUBLICATIONS

Extended European Search Report Dated Jul. 14, 2015, issued in counterpart European Patent Application No. 15151923.8. (8 pages).

* cited by examiner

*Primary Examiner* — Theresa T Doan
(74) *Attorney, Agent, or Firm* — Westerman, Hattori, Daniels & Adrian, LLP

(57) ABSTRACT

An embodiment of a semiconductor device includes a plate line that is connected to ferroelectric capacitors selected from a plurality of ferroelectric capacitors and covers the selected ferroelectric capacitors and regions between the selected ferroelectric capacitors from above top electrodes.

8 Claims, 19 Drawing Sheets

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2014-020552, filed on Feb. 5, 2014, the entire contents of which are incorporated herein by reference.

FIELD

The embodiments discussed herein are directed to a semiconductor device and a method of manufacturing the same.

BACKGROUND

A flash memory, an EEPROM (electrically erasable programmable read-only memory), a ferroelectric memory, and others are exemplified as nonvolatile memories. Data are stored by storing electric charges in a floating gate in the flash memory and in the EEPROM. Data are stored by using polarization inversion of a ferroelectric film in the ferroelectric memory. When these are compared, the ferroelectric memory has the advantage that resistance to radiation rays such as gamma rays, electron rays, and neutron rays is higher than that of the flash memory and the EEPROM.

However, a conventional ferroelectric memory has a problem that when a ferroelectric capacitor is miniaturized, a desired polarization charge amount is not easily secured.

Patent Literature 1: Japanese Laid-open Patent Publication No. 03-256358

SUMMARY

According to an aspect of embodiments, a semiconductor device includes: a plurality of ferroelectric capacitors, each of the ferroelectric capacitors including a bottom electrode, a capacitor insulating film, and a top electrode; a plurality of switching elements, each of the switching elements being connected to one of the ferroelectric capacitors, respectively; a plurality of word lines, each of the word lines switching on and off two or more of the switching elements; a plurality of bit lines, each of the bit lines being connected to two or more of the switching elements; and a plate line that is connected to ferroelectric capacitors selected from the plurality of ferroelectric capacitors and covers the selected ferroelectric capacitors and regions between the selected ferroelectric capacitors from about the top electrodes.

According to another aspect of embodiments, a method of manufacturing a semiconductor device includes: forming a plurality of ferroelectric capacitors, each of the ferroelectric capacitors including a bottom electrode, a capacitor insulating film, and an top electrode; forming a plurality of switching elements, each of the switching elements being connected to one of the ferroelectric capacitors, respectively; forming a plurality of word lines, each of the word lines switching on and off two or more of the switching elements; forming a plurality of bit lines, each of the bit lines being connected to two or more of the switching elements; and forming a plate line that is connected to ferroelectric capacitors selected from the plurality of ferroelectric capacitors and covers the selected ferroelectric capacitors and regions between the selected ferroelectric capacitors from above the top electrodes.

The object and advantages of the invention will be realized and attained by means of the elements and combinations particularly pointed out in the claims.

It is to be understood that both the forgoing general description and the following detailed description are exemplary and explanatory and are not restrictive of the invention.

DESCRIPTION OF EMBODIMENTS

The inventor of the present application examined the reason why a desired polarization charge amount is not easily secured when a ferroelectric capacitor is miniaturized in a conventional ferroelectric memory.

Figure 1:
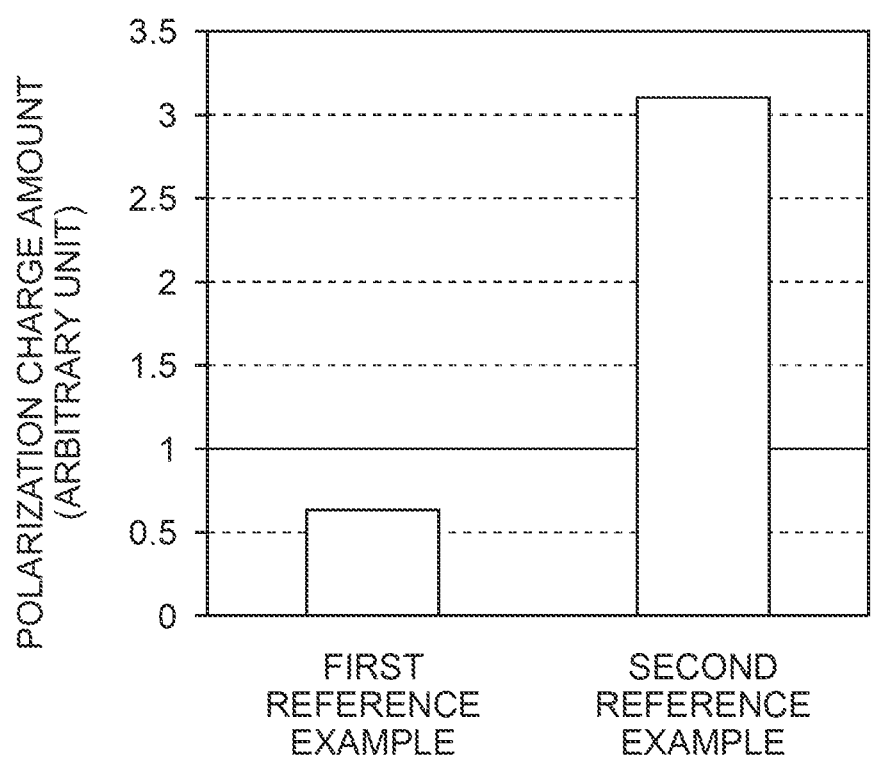
FIG. 1 is a view illustrating a measurement result of a polarization charge amount of reference examples.

First, a relationship between the size of a ferroelectric capacitor and a polarization charge amount was examined. In this examination, each polarization charge amount are measured in a case when the planar shape of a ferroelectric capacitor was set to a square 0.7 µm on a side (a first reference example) and in a case when the planar shape of a ferroelectric capacitor was set to a square 0.87 µm on a side (a second reference example). The first reference example and the second reference example each are an example with a simulated conventional structure. Results of the measurement are illustrated in FIG. 1. The vertical axis in FIG. 1 indicates a value obtained by converting a polarization charge amount necessary for operating a ferroelectric memory provided with the ferroelectric capacitor to 1.

As illustrated in FIG. 1, although a sufficient polarization charge amount was able to be obtained in the second reference example, a sufficient polarization charge amount could not be obtained in the smaller first reference example. As above, it was recognized that the polarization charge amount falls short by miniaturizing the ferroelectric capacitor.

Further, it was found that the polarization charge amount after formation of a multilayer wiring including a plate line decreases as compared to before formation of the multilayer wiring, through an examination relating to a relationship between a manufacturing process and a polarization charge amount of a ferroelectric capacitor. That is, it was found that in-process degradation occurs. Further, it was also found that such in-process degradation is more prominent as the ferroelectric capacitor is smaller. In order to suppress the in-process degradation, a measure has been taken such that a protective film such as an aluminum oxide film is formed so as to cover the ferroelectric capacitor until now, but it is getting difficult to sufficiently suppress the in-process degradation as the ferroelectric capacitor is miniaturized. Thus, the inventor further performed earnest examination so that the in-process degradation could be suppressed, and consequently reached the following embodiments.

Hereinafter, embodiments will be explained concretely with reference to the attached drawings.

First Embodiment

Figure 2A:
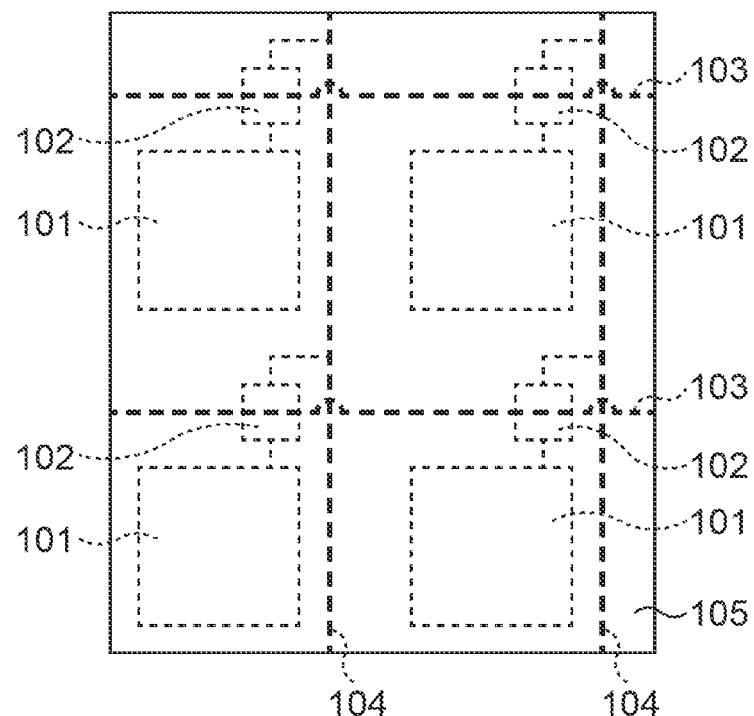
FIGS. 2A and 2B are views each illustrating a structure of a semiconductor device according to a first embodiment.
Figure 2B:
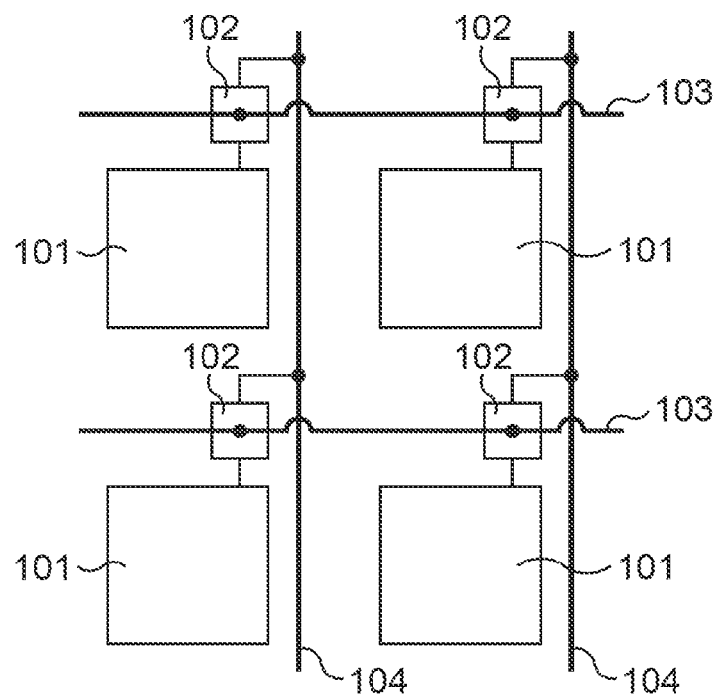

First, a first embodiment will be explained. FIG. 2A and FIG. 2B are views each illustrating a structure of a semiconductor device according to the first embodiment.

In the semiconductor device according to the first embodiment, as illustrated in FIG. 2A and FIG. 2B, a plurality of ferroelectric capacitors 101, a plurality of switching elements 102, a plurality of word lines 103, a plurality of bit lines 104, and a plate line 105 are provided. A bottom electrode, a capacitor insulating film, and a top electrode are provided in each of the ferroelectric capacitors 101. Each of the switching elements 102 is connected to one of the ferroelectric capacitors 101, respectively. Each of the word line 103 switches on and off two or more of the switching elements 102. Each of the bit lines 104 is connected to two or more of the switching elements 102. The plate line 105 is connected to a part or all of ferroelectric capacitors 101 selected from the plurality of ferroelectric capacitors 101, and covers the selected ferroelectric capacitors 101 and regions between the selected ferroelectric capacitor 101 from above the top electrodes of the ferroelectric capacitors 101. Ferroelectric capacitors 101 connected to two or more of the switching elements 102 that are switched on and off by the individual word lines 103 are included in the selected ferroelectric capacitors 101, and ferroelectric capacitors 101 connected to two or more of the switching elements 102 connected to the individual bit lines 104 are included in the selected ferroelectric capacitors 101. Thus, the ferroelectric capacitors 101 connected to the plate line 105 and the regions between the ferroelectric capacitors 101 are within the outline of the plate line 105 in planar view. In the first embodiment, the four ferroelectric capacitors 101 correspond to the selected ferroelectric capacitors 101. Incidentally, FIG. 2A illustrates the plate line 105 and the structure under the plate line 105, and FIG. 2B illustrates the structure under the plate line 105.

In the first embodiment, such a structure is employed, so that it is possible to significantly suppress in-process degradation that the ferroelectric capacitors 101 and subjected to when a wiring layer and others above the top electrodes of the ferroelectric capacitors 101 are formed. Thus, a sufficient polarization charge amount can be obtained even when the ferroelectric capacitors 101 is miniaturized.

Second Embodiment

Figure 3A:
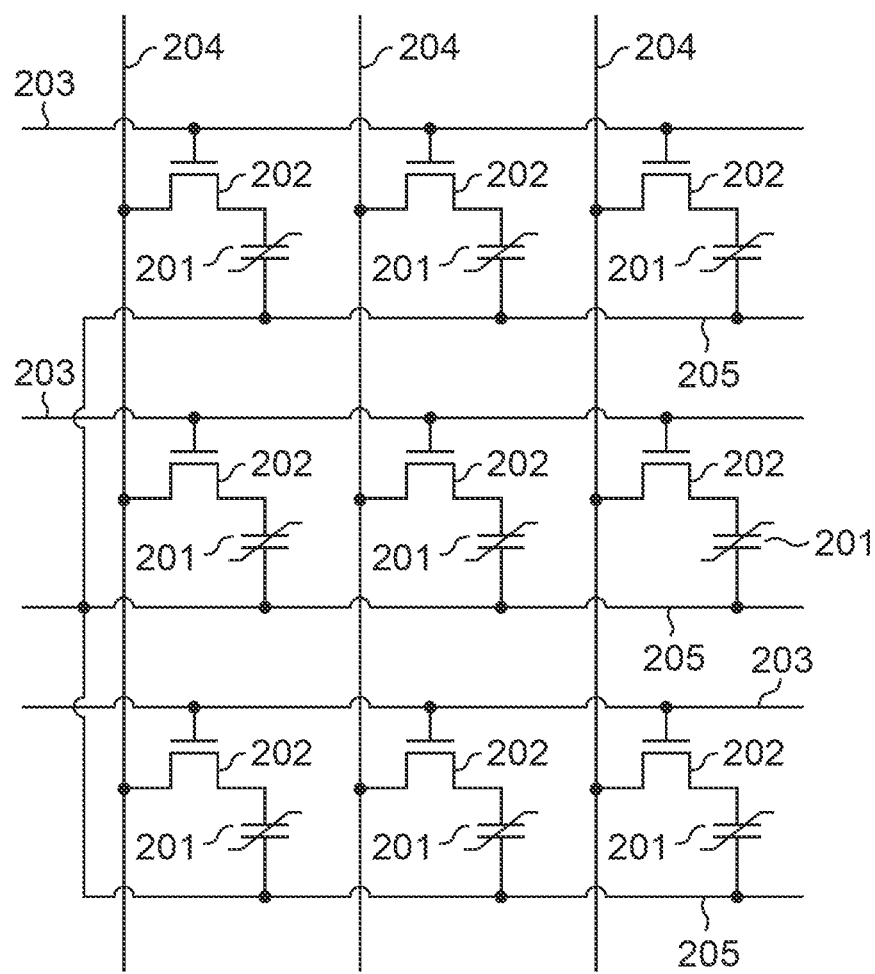
FIG. 3A is a circuit diagram illustrating a structure of a semiconductor device according to a second embodiment.

Next, a second embodiment will be explained. The second embodiment is an example of a ferroelectric memory. FIG. 3A is a circuit diagram illustrating a structure of a semiconductor device according to the second embodiment, and FIG. 3B is a cross-sectional view illustrating the structure of the semiconductor device according to the second embodiment.

Figure 3B:
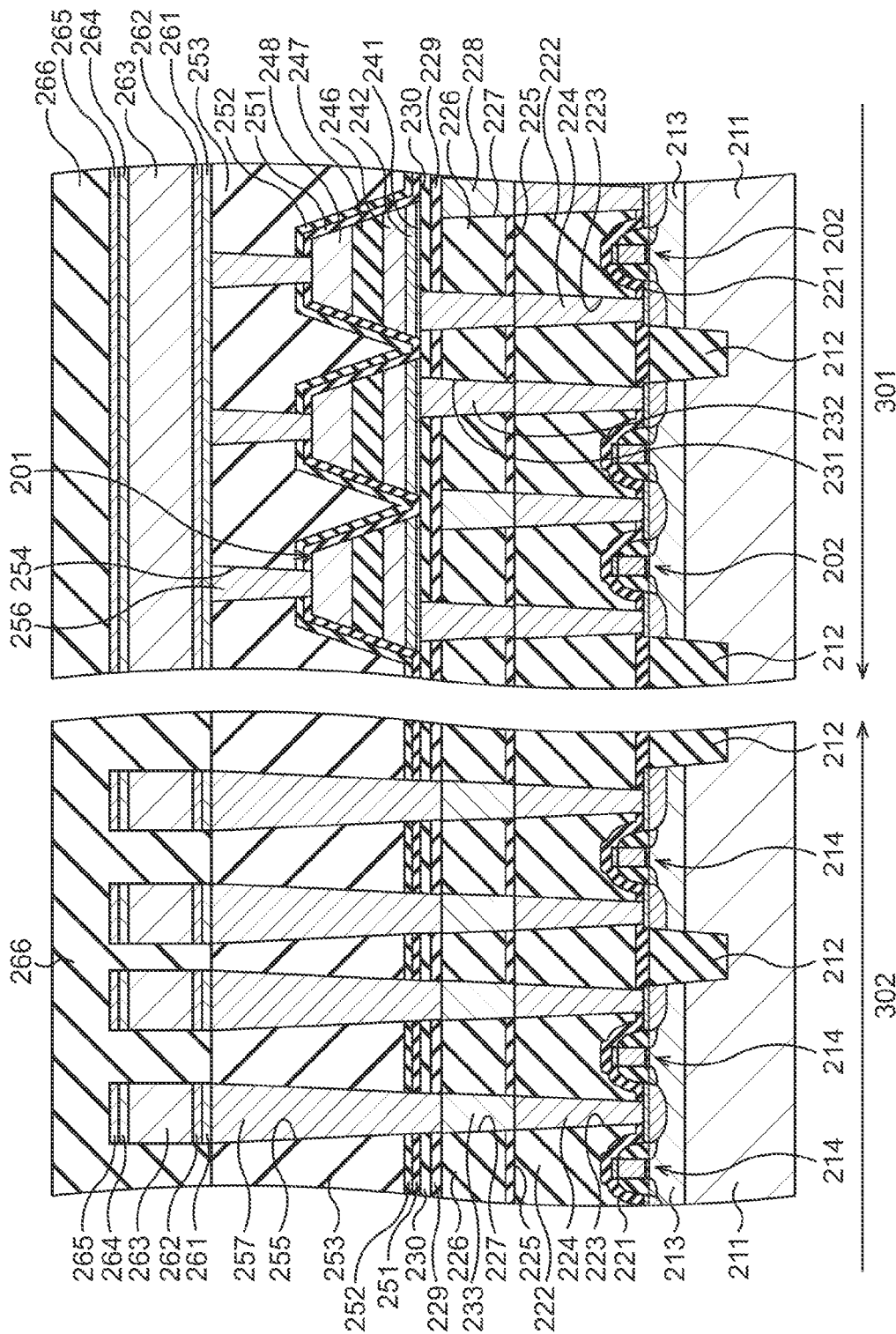
FIG. 3B is a cross-sectional view illustrating the structure of the semiconductor device according to the second embodiment.

A memory cell region 301 and a peripheral circuit region 302 are provided in the second embodiment, as illustrated in FIG. 3B. A plurality of ferroelectric capacitors 201, a plurality of switching elements 202, a plurality of word lines 203, a plurality of bit lines 204, and a plate line 205 are provided in the memory cell region 301, as illustrated in FIG. 3A. A bottom electrode 246, a capacitor insulating film 247, and a top electrode 248 are provided in each of the ferroelectric capacitors 201, as illustrated in FIG. 3B. Each of the switching elements 202 is connected to one of the ferroelectric capacitors 201, respectively. Each of the word lines 203 switches on and off two or more of the switching elements 202. Each of the bit lines 204 is connected to two or more of the switching elements 202. The plate line 205 is connected to ferroelectric capacitors 201 selected from the plurality of ferroelectric capacitors 201 and covers the selected ferroelectric capacitors 201 and regions between the selected ferroelectric capacitors 201 from above the top electrodes 248. Ferroelectric capacitors 201 connected to two or more of the switching elements 202 that are switched on an off by the individual word lines 203 are included in the selected ferroelectric capacitors 201, and ferroelectric capacitors 201 connected to two or more of the switching elements 202 connected to the individual bit lines 204 are included in the selected ferroelectric capacitors 201.

Figure 4A:
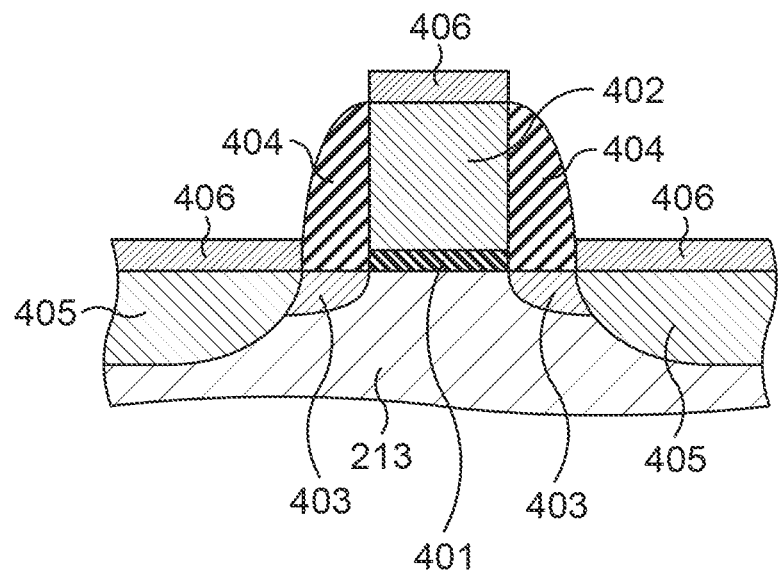
FIG. 4A is a cross-sectional view illustrating a structure of a field-effect transistor.

A semiconductor substrate 211 such as an n-type or p-type silicon substrate in both of the memory cell region 301 and the peripheral circuit region 302 is included in this semiconductor device, as illustrated in FIG. 3B. An element isolation region 212 defining active regions of transistors is formed in the surface of the semiconductor substrate 211. A P well 213 is formed in the active region, and the switching elements 202 with the P well 213 are formed. The switching element 202 is a field-effect translator, for example. The field-effect transistor includes, for example, a gain insulating film 401, a gate electrode 402, an impurity implanted region 403, an insulating sidewall 404, an impurity implanted region 405, and a silicide layer 406, as illustrated in FIG. 4A. The gate electrode 402 functions as the word line 203.

A cover film 221 covering the switching elements 202 is formed over the semiconductor substrate 211, and an interlayer insulating film 222 is formed over the cover film 221. A contact hole 223 exposing the silicide layer 406 is formed in the interlayer insulating film 222 and the cover film 221, and a conductive plug 224 is formed in the contact hole 223. An etching stopper film 225 is formed over the interlayer insulating film 222 and the conductive plugs 224, and an interlayer insulating film 226 is formed over the etching stopper film 225. An opening 227 is formed in the interlayer insulating film 226 and the etching stopper film 225, and a wiring 228 is formed in the opening 227 in the memory cell region 301. The wiring 228 is connected to a part of the conductive plugs 224 and functions as the bit line 204. A conductive plug 233 is formed in the opening 227 and the conductive plugs 233 are connected to a part of the conductive plugs 224 in the peripheral circuit region 302. An oxidation preventing film 229 is formed over the interlayer insulating film 226, and a buffer film 230 is formed over the oxidation preventing film 229. A contact hole 231 exposing the conductive plug 224 is formed in the buffer film 230, the oxidation preventing film 229, the interlayer insulating film 226, and the etching stopper film 225, and a conductive plug 232 is formed in the contact hole 231 in the memory cell region 301.

A titanium nitride film 241 and a titanium aluminum nitride film 242 are formed over the buffer film 230 and the conductive plugs 232. The ferroelectric capacitors 201 are formed above the titanium aluminum nitride film 242 in the memory cell region 301. Each of the ferroelectric capacitors 201 includes the bottom electrode 246, the capacitor insulating film 147, and the top electrode 248. The titanium nitride film 241 and the titanium aluminum nitride film 241 are patterned similarly to the bottom electrode 246, the capacitor insulating film 247, and the top electrode 248, and the bottom electrode 246 of one of the ferroelectric capacitors 201 is electrically connected to one of the conductive plugs 232.

Figure 4B:
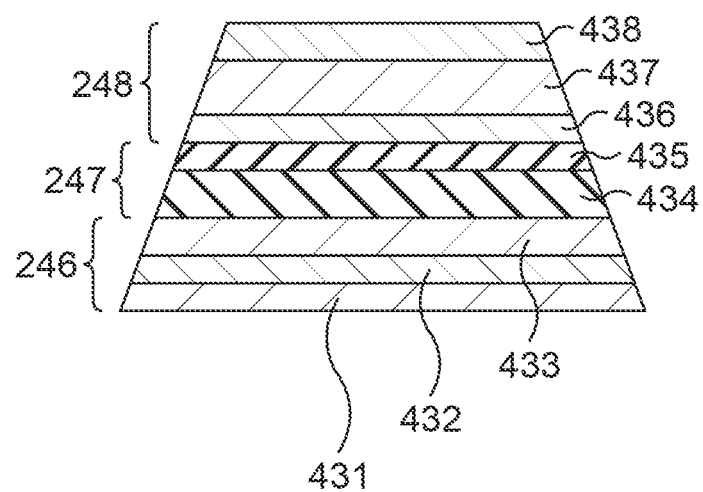
FIG. 4B is a cross-sectional view illustrating a structure of a ferroelectric capacitor.

The bottom electrode 246 of the ferroelectric capacitor 201 includes an iridium film 431, an iridium oxide film 432, and a platinum film 433, as illustrate din FIG. 4B. The capacitor insulating film 247 includes a ferroelectric film 434 and a ferroelectric film 435. The ferroelectric film 434 and the ferroelectric film 435 are different in composition, for example. The top electrode 248 includes an iridium oxide film 436, an iridium oxide film 437, and an iridium film 438. The oxidation degree of the iridium oxide film 437 is higher than that of the iridium oxide film 436, for example.

A protective film 251 covering the ferroelectric capacitors 201 is formed over the buffer film 230, a protective film 252 is formed over the protective film 251, and an interlayer insulating film 253 is formed over the protective film 252. A contact hole 254 exposing the top electrode 248 is formed in the interlayer insulating film 253, the protective film 252, and the protective film 251, and a conductive plug 256 is formed in the contact hole 254. In the peripheral circuit region 302, a contact hole 255 exposing the conductive plug 233 is formed in the interlayer insulating film 253, the protective film 252, the protective film 251, the buffer film 230, and the oxidation preventing film 229, and a conductive plug 257 is formed in the contact hole 255.

A stacked structure conductive film is formed over the interlayer insulating film 253, the conductive plug 256, and the conductive plug 257. The stacked structure conductive film includes a titanium film 261, a titanium nitride film 262, an AlCu alloy film 263, a titanium nitride film 264, and a titanium nitride film 265. The stacked structure conductive film is patterned and functions as the plate line 205 in the memory cell region 301. The plate line 205 is connected to a part or all of ferroelectric capacitors 201 selected from the plurality of ferroelectric capacitors 201, and covers the selected ferroelectric capacitors 201 and regions between the selected ferroelectric capacitors 201 from above the top electrodes 248. Ferroelectric capacitors 201 connected to two or more of the switching elements 202 that are switched on and off by the individual word lines 203 are included in the selected ferroelectric capacitors 201, and ferroelectric capacitors 201 connected to two or more of the switching elements 202 connected to the individual bit lines 204 are included in the selected ferroelectric capacitors 201. Thus, the ferroelectric capacitors 201 connected to the plate line 205 and the regions between the ferroelectric capacitors 201 are within the outline of the plate line 205 in planar view. In the peripheral circuit region 302, the patterned stacked structure conductive film functions as a wiring of peripheral circuits. An interlayer insulating film 266 covering the patterned stacked structure conductive film is formed over the inter layer insulating film 253.

As above, she plate line 205 (stacked structure conductive film) covers the predetermined ferroelectric capacitors 201 and the regions between the predetermined ferroelectric capacitors 201 from above the top electrodes 248 in the second embodiment. Therefore, it is possible to significantly suppress in-process degradation that the ferroelectric capacitors 201 are subjected to when the interlayer insulating film 266 is formed and an upper wiring layer and others are formed. Thus, a sufficient polarization charge amount can be obtained even when the ferroelectric capacitor 201 is miniaturized.

Further, the ferroelectric capacitors 201 are disposed above the wirings 228, which functions as the bit lines 204, in this embodiment. That is, a capacitor over bit line (COB) structure is employed. Then, since the COB structure is employed, a structure in which the plate line 205 (stacked structure conductive film) covers the predetermined ferroelectric capacitors 201 and the regions between the predetermined ferroelectric capacitors 201 from above is quite effective.

The number of the ferroelectric capacitors 201 that the plate line 205 covers from above is not limited to particular one, and a larger number of the ferroelectric capacitors 201 and regions between the ferroelectric capacitors 201 are preferably covered with the single plate line 205. That is, it is preferred that the number of the palate lines 205 to be included in the single semiconductor device should be small and a gap between the plate lines 205 should be smaller.

For example, when ferroelectric capacitors, which are 100 pieces each arranged vertically and horizontally to be 10000 pieces in total, are provided, these may be grouped into four blocks which are 50 pieces each arranged vertically and horizontally to be 2500 pieces in total, and a single plate line may be provided in each block. In this case, the 2500 pieces of ferroelectric capacitors included in each block are an example of the selected ferroelectric capacitors, and 50 word lines and 50 bit lines included in each block are examples of the individual word lines and the individual bit lines.

Next, a method of manufacturing the semiconductor device according to the second embodiment will be explained. FIG. 5A to FIG. 5G are cross-sectional views illustrating the method of manufacturing the semiconductor device according to the second embodiment in the order of steps.

Figure 5A:
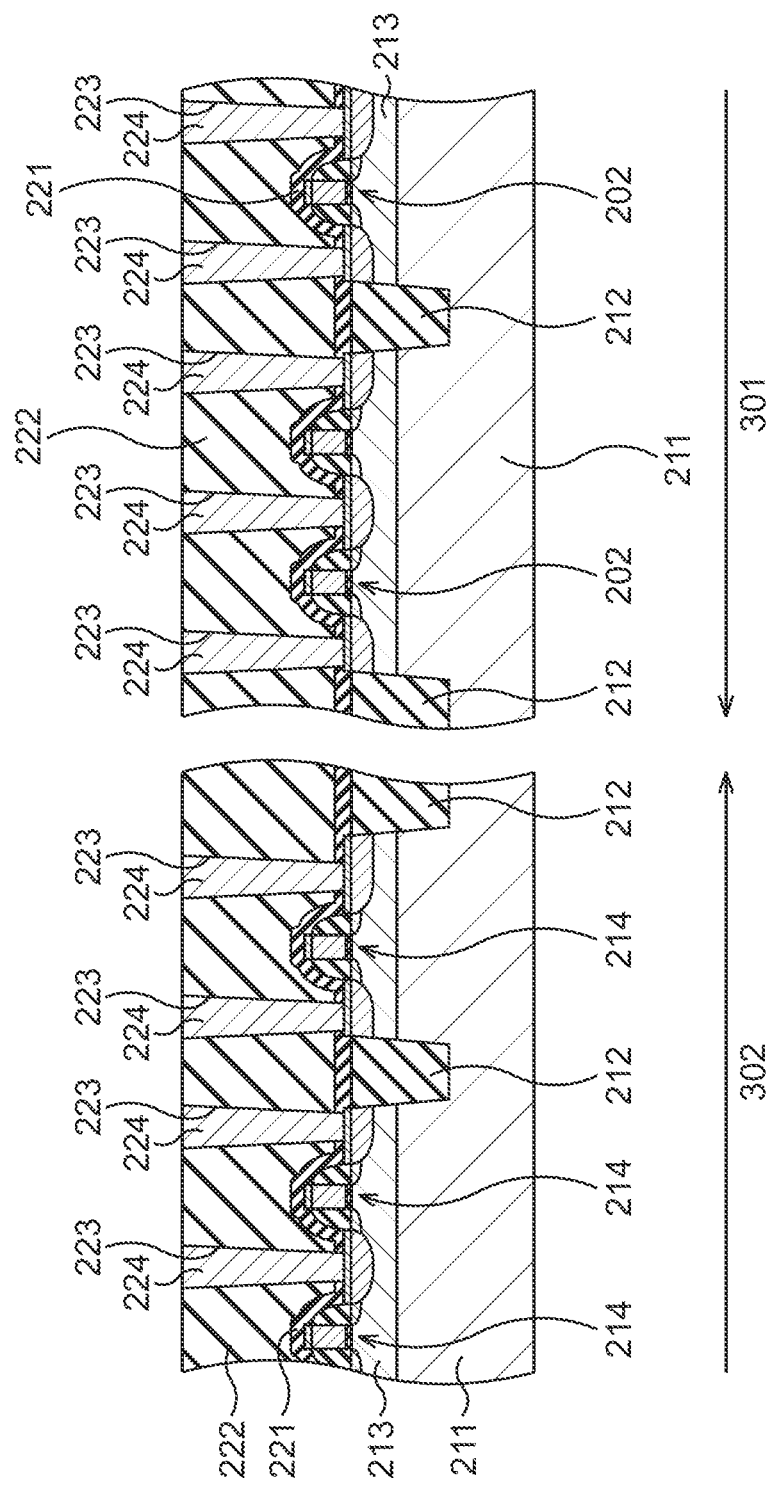
FIG. 5A to FIG. 5G are cross-sectional views illustrating a method of manufacturing the semiconductor device according to the second embodiment in the order of steps.

First, as illustrated in FIG. 5A, the element isolation region 212 defining the active regions of transistors is formed in the surface of the semiconductor substrate 211. A shallow trench isolation (STI) is formed as the element isolation region 212, for example. The STI may be formed by forming a trench in the surface of the semiconductor substrate 211 and filling the trench with an insulating film such as a silicon oxide film. An insulating film may be formed as the element isolation region 212 by a local oxidation of silicon (LOCOS) method. Then, an impurity is introduced into the active region so as to form the P well 213, for example. Thereafter, the switching elements 202 are formed in the active regions in the memory cell region 301. The field-effect transistor illustrated in FIG. 4A, for example, is formed as the switching element 202.

In the formation of the field-effect transistor, first, the gate insulating film 401 is formed over the surface of the active region. The gate insulating film 401 may be formed by thermal oxidation, for example. Then, the gate electrode 402 is formed on the gate insulating film 401. The gate electrode 402 may be formed by forming an amorphous or polycrystalline silicon film over the entire upper surface of the semiconductor substrate 211 and patterning the silicon film by a photolithography method, for example. Thereafter, an n-type impurity is ion-implanted into the P well 213 on the both sides of the gate electrode 402 using the gate electrode 402 as a mask so as to form the n-type impurity implanted region 403 as an extension region. Subsequently, the insulating sidewall 404 is formed on side surface so the gate electrode 402. The sidewall 404 may be formed by forming an insulating film over the semiconductor substrate 211 and the gate electrode 402 and etching back the insulating film, for example. A silicon oxide film is formed as the insulating film by a chemical vapor deposition (CVD) method, for example. Then an n-type impurity is ion-implanted into the P wells 213 using the sidewall 404 and the gate electrode 402 as a mask at concentration higher than that when the impurity implanted region 403 is formed, so as to form the n-type impurity implanted region 405. As a result, a source/drain region with the impurity implanted region 403 and the impurity implanted region 405 may be obtained. After the formation of the impurity implanted region 405, the silicide layer 406 is formed on the gate electrode 402 and on the impurity implanted region 405. In the formation of the silicide layer 406, a metal film such as a cobalt film is formed by a sputtering method and the metal film is heated to be brought to react with silicon. Then, an unreacted portion of the metal film is removed by wet etching. The similar field-effect transistor 214 is formed also in the peripheral circuit region 302.

Figure 6A:
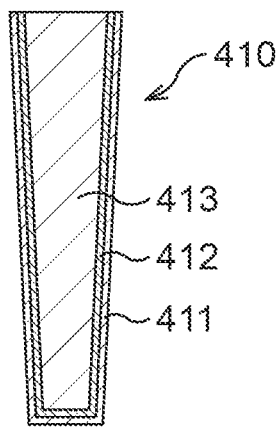
FIG. 6A is a cross-sectional view illustrating an example of a structure of a conductive stack.

Then, the cover film 221 covering the switching elements 202 is formed. A silicon nitride film having a thickness of about 70 nm, for example, is formed as the cover film 221 by a plasma CVD method. Then, the interlayer insulating film 222 is formed over the over film 221. A silicon oxide film having a thickness of about 1.1 µm, for example, is formed as the interlayer insulating film 222 by a plasma CVD method using a gas containing tetraethoxysilane (TEOS). Subsequently, the upper surface of the interlayer insulating film 222 is polished by a chemical-mechanical polishing (CMP) method to be flat. The thickness of the interlayer insulating film 222 after the polishing may be about 600 nm above the flat surface of the semiconductor substrate 211, for example. Then, the contact hole 223 exposing the silicide layer 406 is formed in the interlayer insulating film 222 and the cover film 221. In the formation of the contact hole 223, the interlayer insulating film 222 and the cover film 221 are patterned by a photolithography method, for example. The diameter of the contact hole 223 may be 0.20 µm, for example. Thereafter, the conductive plug 224 is formed in the contact hole 223. As the conductive plug 224, one having a stacked structure similar to that of a conducive stack 410 illustrated in FIG. 6A, for example, may be used. More specifically, for example, a titanium film 411 having a thickness of 30 µm and a titanium nitride film 412 having a thickness of 20 nm may be formed sequentially as an adhesive film (glue film) by a CVD method in the contact hole 223, and a tungsten film 413 may be formed by a CVD method on the titanium nitride film 412. Then, the tungsten film 413, the titanium nitride film 412, and the titanium film 411 may be polished by a CMP method until the upper surface of the interlayer insulating film 222 is exposed.

Figure 5B:
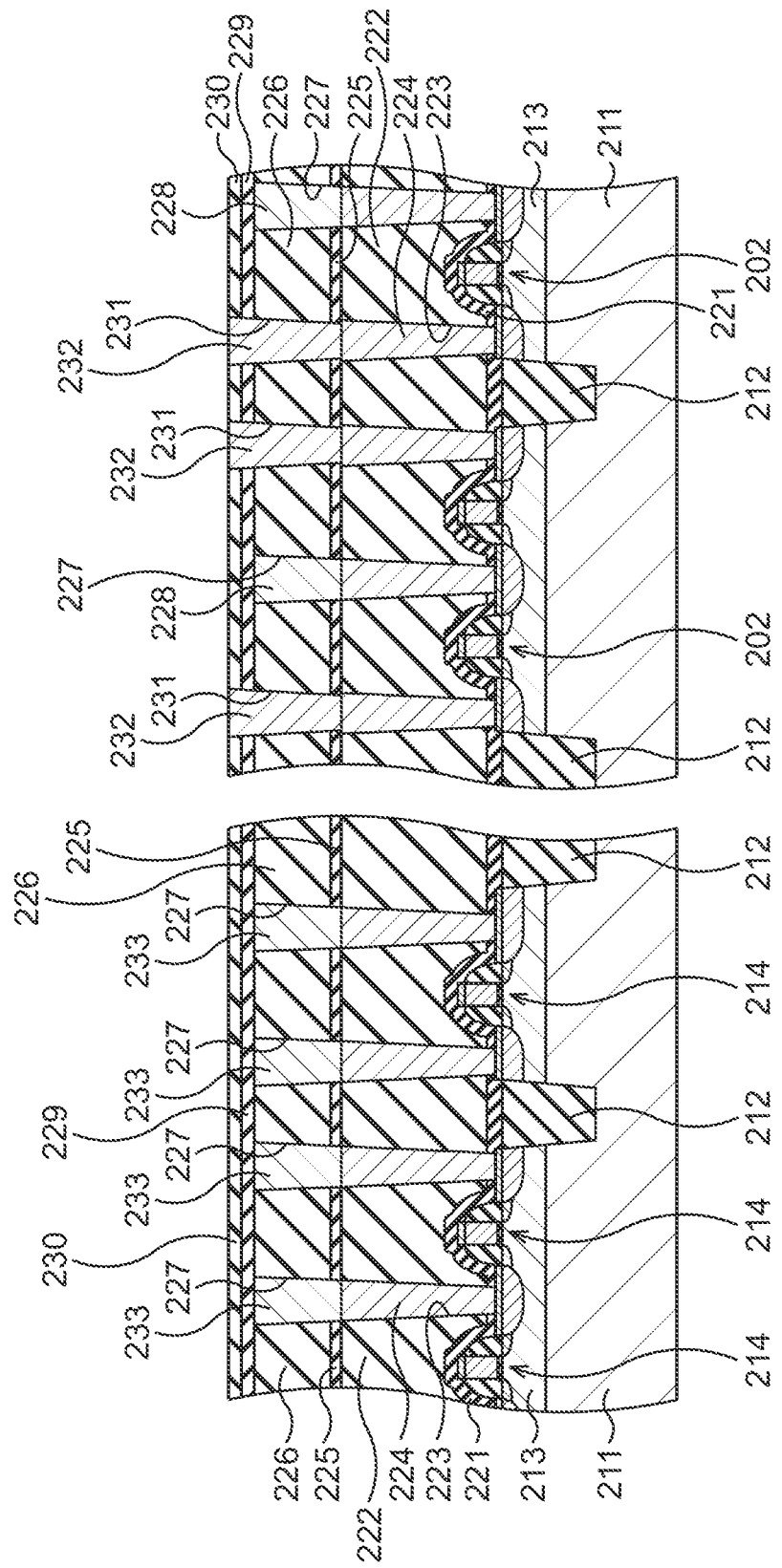

Then, an illustrated in FIG. 5B, the etching stopper film 225 is formed over the interlayer insulating film 222 and the conductive plugs 224. A silicon nitride film having a thickness of about 30 nm, for example, is formed as the etching stopper film 225. Thereafter, the interlayer insulating film 226 is formed over the etching stopper film 225. A silicon oxide film having a thickness of about 350 nm, for example, is formed as the interlayer insulating film 226 by a plasma CVD method using a gas containing TEOS. Subsequently, the opening 227 exposing a part of the conductive plug 224 is formed in a region of the interlayer insulating film 226 and the etching stopper film 225 where the bit line 204 is to be formed. In the formation of the opening 227, for example, a silicon nitride film is formed as a sacrificial film over the interlayer insulating film 226, an opening reaching the etching stopper film 226 is formed in the sacrificial film and the interlayer insulating film 226 using a photoresist mask, the mask is removed, and the sacrificial film and the etching stopper film 225 are etched. The similar opening 227 exposing the conductive plug 224 is formed also in the peripheral circuit region 302.

After the formation of the opening 227, the wiring 228 as the bit line 204 is formed in the opening 227 in the memory cell region 301. As the wiring 228, one having a stacked structure similar to that of the conductive stack 410 illustrated in FIG. 6A, for example, may be formed. More specifically, for example, the titanium film 411 having a thickness of 10 nm and the titanium nitride film 412 having a thickness of 20 nm may be formed sequentially as an adhesive film (glue film) by a CVD method in the opening 227, and the tungsten film 413 may be formed by a CVD method on the titanium nitride film 412. Then, the tungsten film 413, the titanium nitride film 412, and the titanium film 411 may be polished by a CMP method until the upper surface of the interlayer insulating film 226 is exposed. In parallel with the formation of the wiring 228, the conductive plug 233 is formed in the opening 227 in the peripheral circuit region 302.

After the formation of the wiring 228 and the conductive plug 233, the oxidation preventing film 229 is formed over the interlayer insulating film 226 and the wiring 228. A silicon nitride film having thickness of 30 nm, for example, is formed as the oxidation preventing film 229. Oxidation of the wiring 228 to be caused in the formation of the contact hole 231 later or others is prevented by the oxidation preventing film 229. Then, the buffer film 230 is formed over the oxidation preventing film 229. A silicon oxide film having a thickness of about 200 nm, for example, is formed as the buffer film 230 by a plasma CVD method using a gas containing TEOS. The buffer film 230, as will be described later, suppresses damage to a lower portion to be caused when etching for forming ferroelectric capacitors 201 is performed. The buffer film 230 can improve adhesiveness with the ferroelectric capacitors 201. Thereafter, the contact hole 231 exposing the conductive plug 224 is formed in the buffer film 230, the oxidation preventing film 229, the interlayer insulating film 226, and the etching stopper film 225. In the formation of the contact holes 231, the buffer film 230, the oxidation preventing film 229, and the interlayer insulating film 226 are patterned by a photolithography method, for example. The diameter of the contact hole 231 may be 0.2 µm, for example. Subsequently, the conductive plug 232 is formed in the contact hole 231. As the conductive plug 232, one having a stacked structure similar to that of the conductive stack 410 illustrated in FIG. 6A, for example, may be formed. More specifically, for example, the titanium film 411 having a thickness of 10 nm and the titanium nitride film 412 having a thickness of 20 nm may be formed sequentially as an adhesive film (glue film) by a CVD method in the contact hole 231, and the tungsten film 413 may be formed by a CVD method on the titanium nitride film 412. Then, the tungsten film 413, the titanium nitride film 412, and the titanium film 411 may be polished by a CMP method until the upper surface of the buffer film 230 is exposed. At this time, film thinning due to polishing by the CMP method may be stopped inside the buffer film 230, and the oxidation preventing film 229 under the buffer film 230 can be prevented from being polished.

Figure 5C:
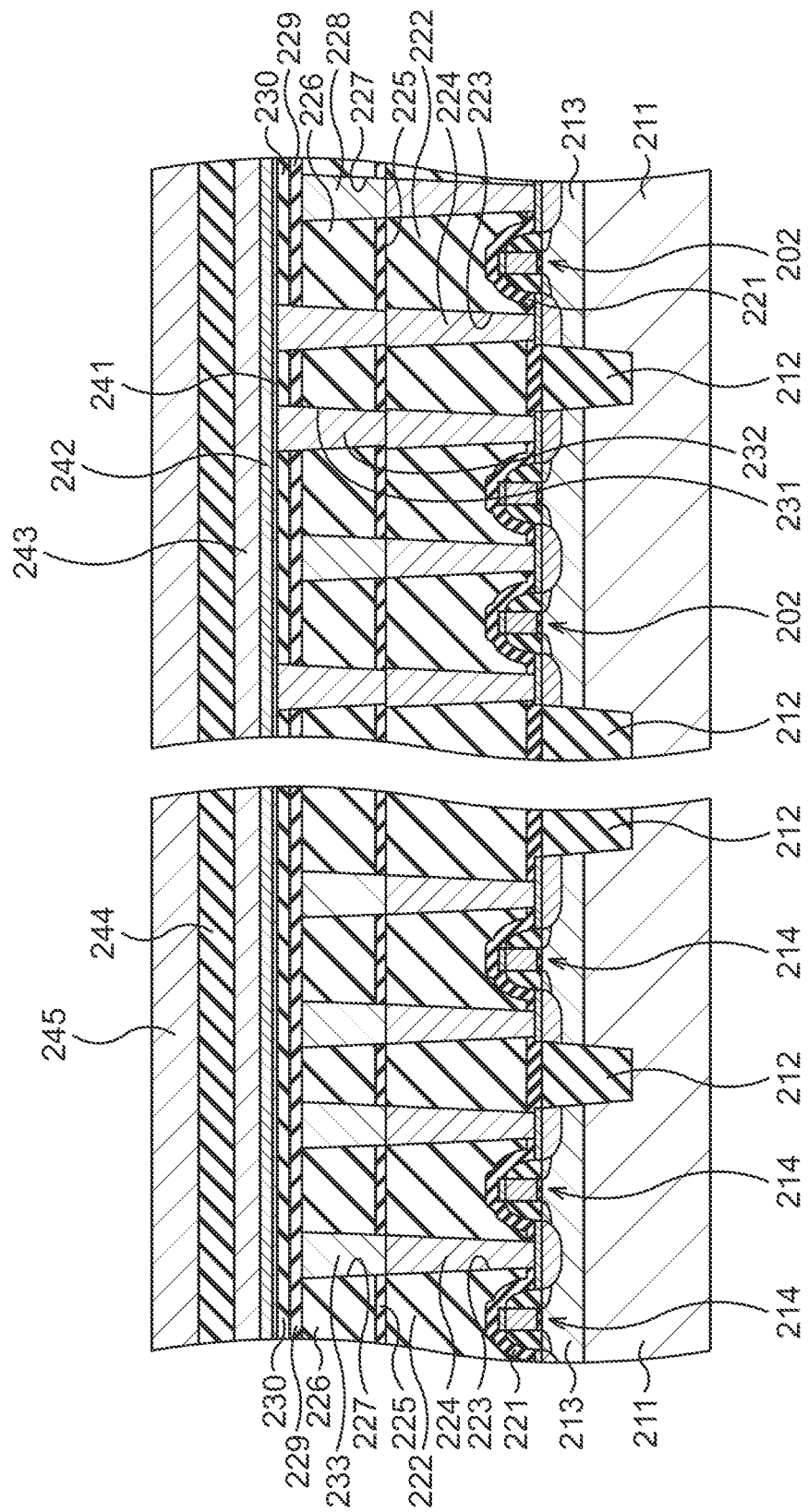

Then, as illustrated in FIG. 5C, a titanium film having at thickness of 5 nm, for example, is formed over the buffer film 230 and the conductive plugs 232, and a nitriding treatment by a RTA (rapid thermal annealing) method is performed so as to form the titanium nitride film 241. Although the upper surface of the conductive plug 232 may be positioned lower than the upper surface of the buffer film 230 and a recessed portion may exist due to an effect of CMP, the recessed portion is covered with the titanium nitride film 241. Thereafter, the titanium aluminum nitride film 242 is formed over the titanium nitride film 241. In the formation of the titanium aluminum nitride film 242, a titanium aluminum nitride film having a thickness of 40 nm, for example, is formed and is polished to a thickness of about 20 nm by a CMP method, and another titanium aluminum nitride film having a thickness of 25 nm is newly formed. The titanium aluminum nitride film 242 has oxidation resistance. Subsequently, the conductive film 243, the ferroelectric film 244, and the conductive film 245 are formed over the titanium aluminum nitride film 242.

In the formation of the conductive film 243, as illustrated in FIG. 4B, for example, the iridium film 431 having a thickness of 30 nm, the iridium oxide film 432 having a thickness of 30 nm, and the platinum film 431 having a thickness of 50 nm may be formed. The iridium oxide film 432 contributes to improvement in adhesiveness and cancellation of orientation. The platinum film 433 contributes to improvement in orientation.

In the formation of the ferroelectric film 244, as illustrated in FIG. 4B, for example, the ferroelectric film 434 having a thickness of 75 nm, which is a PZT ($PB(Zr_x, Ti_{1-x})O_3$) film (0<x<1), for example, may be formed, and a heat treatment may be performed by a RTA method in a mixed gas atmosphere of argon and oxygen. Grains of the ferroelectric film 434 are oriented to be matched with orientation of grains of the platinum film 433 by the heat treatment. Then, the ferroelectric film 435 having a thickness of 10 nm in an amorphous state may be formed over the ferroelectric film 434. The formation of the ferroelectric film 435 may be skipped.

In the formation of the conductive film 245, as illustrated in FIG. 4B, for example, the iridium oxide film 436 having a thickness of 25 nm may be formed. A film to be crystallized when it is formed is formed as the iridium oxide film 436, for example, by a sputtering method. In the formation of the iridium oxide film 436, for example, pressure may be 2 Pa, a substrate temperature may be 300° C., an iridium target may be used, a mixed gas of argon and oxygen may be used as a reactive gas, and sputtering power may be bout 1 kW to 2 kW, for example. On this occasion, a flow rate ratio of argon gas and oxygen gas may be 100 to 56, for example. When the formation of the ferroelectric film 435 is skipped, the conductive film 245 is formed on the ferroelectric film 434. Then, a heat treatment may be performed by a PTA method in an oxygen-containing atmosphere. In this heat treatment, for example, a mixed gas of argon and oxygen may be used, a flow rate ratio of argon gas and oxygen gas may be 100 to 1, a substrate temperature may be 725° C., and a heat treatment time period may be 60 seconds. Iridium atoms contained in the iridium oxide film 436 diffuse into the ferroelectric film 244 and the ferroelectric film 435 is crystallized by this heat treatment.

After this heat treatment, the iridium oxide film 437 higher in oxidation degree than the iridium oxide film 436 may be formed over the iridium oxide film 436. An $IrO_2$ film may be formed as the iridium oxide film 437, for example. The temperature at which the iridium oxide film 437 is formed is preferably set to 100° C. or lower. This is to suppress abnormal growth. Iridium oxide has a catalytic activity that activates hydrogen atoms into hydrogen radicals, and the higher the oxidation degree is, the lower the catalytic activity is. The hydrogen radical reduces ferroelectric, so that as the oxidation degree of iridium oxide is higher, ferroelectric is not reduced more easily. Thus, the iridium oxide film 437 higher in oxidation degree than the iridium oxide film 436 is formed, thereby making it possible to suppress reduction of the ferroelectric film 244 with hydrogen radicals. Then, the iridium film 438 having a thickness of 80 nm, for example, may be formed over the iridium oxide film 437. The iridium film 438 contributes to a decrease in contact resistance. Thereafter, the rear surface of the semiconductor substrate 211 is cleaned.

Figure 5D:
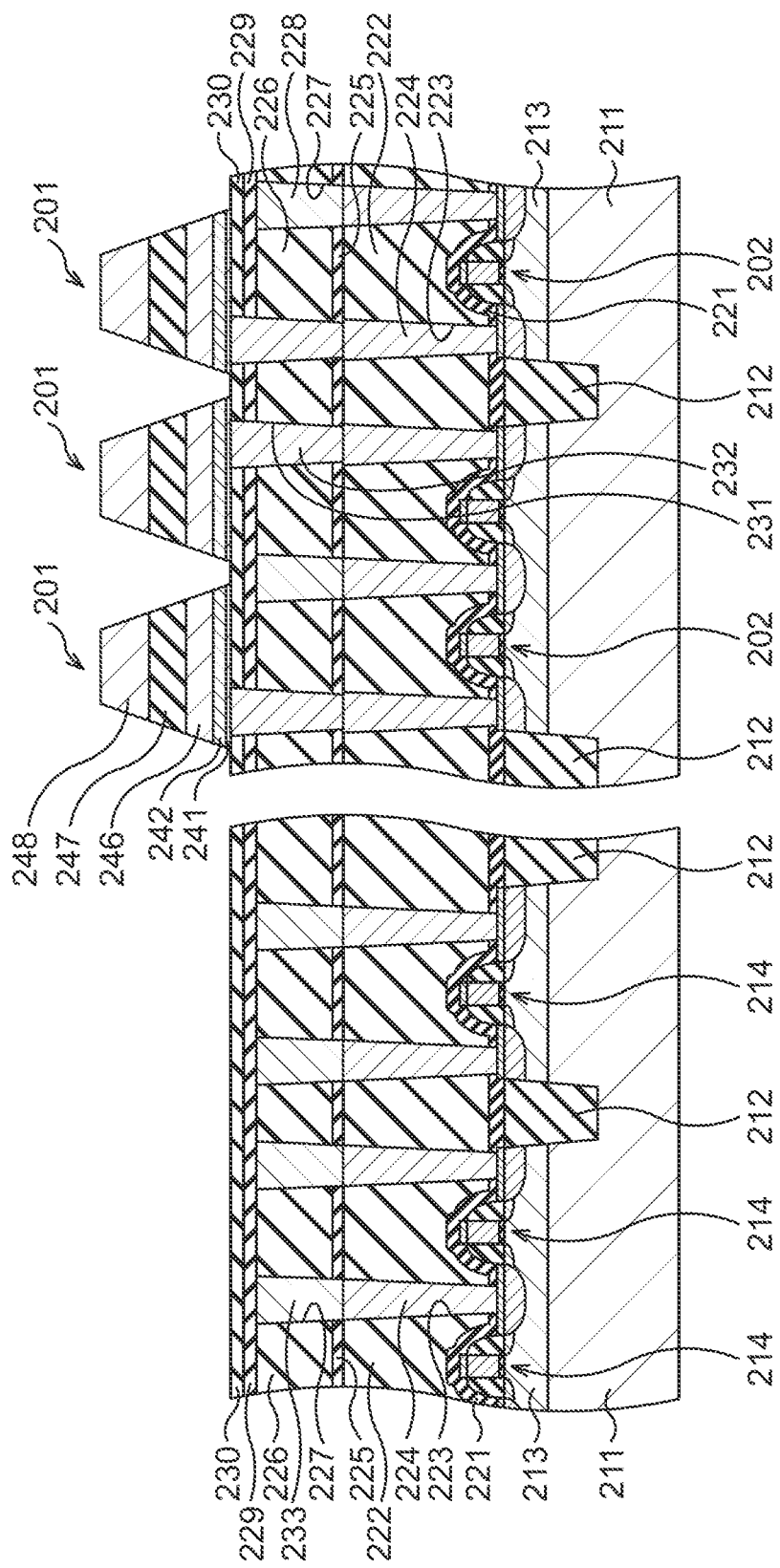

Subsequently, as illustrated in FIG. 5D, the conductive film 245, the ferroelectric film 244, the conductive film 243, the titanium aluminum nitride film 242, and the titanium nitride film 241 are patterned, so as to form the ferroelectric capacitor 201 including the top electrode 248, the capacitor insulating film 247, and the bottom electrode 246. At this time, it is designed that the bottom electrode 246 is electrically connected to the conductive plug 232. For example, the bottom electrode 246 includes the iridium film 431, the iridium oxide film 432, and the platinum film 433, the capacitor insulating film 247 includes the ferroelectric film 434, and the ferroelectric film 435, and the top electrode 248 includes the iridium oxide film 436, the iridium oxide film 437, and the iridium film 438. In the patterning of the conductive film 245, the ferroelectric film 244, the conductive film 243, the titanium aluminum nitride film 242, and the titanium nitride film 241, a conductive film for mask and an insulating film for mask are formed over the conductive film 245, these films are patterned by a photolithography method to form a hard mask, and etching of the conductive film 245 and others is performed using the hard mask. This etching is finished inside the buffer film 230. Finishing the etching inside the buffer file 230 makes it possible to suppress damage to a lower portion. A titanium aluminum nitride film having a thickness of bout 200 nm, for example, may be formed as the conductive film for mask by a sputtering method, and a silicon oxide film having a thickness of about 280 nm, for example, may be formed as the insulating film for mask by a plasma CVD method using a gas containing TEOS. After the formation of the ferroelectric capacitors 201, annealing for 40 minutes is performed at a temperature of 350° C. in an oxygen atmosphere.

Figure 5E:
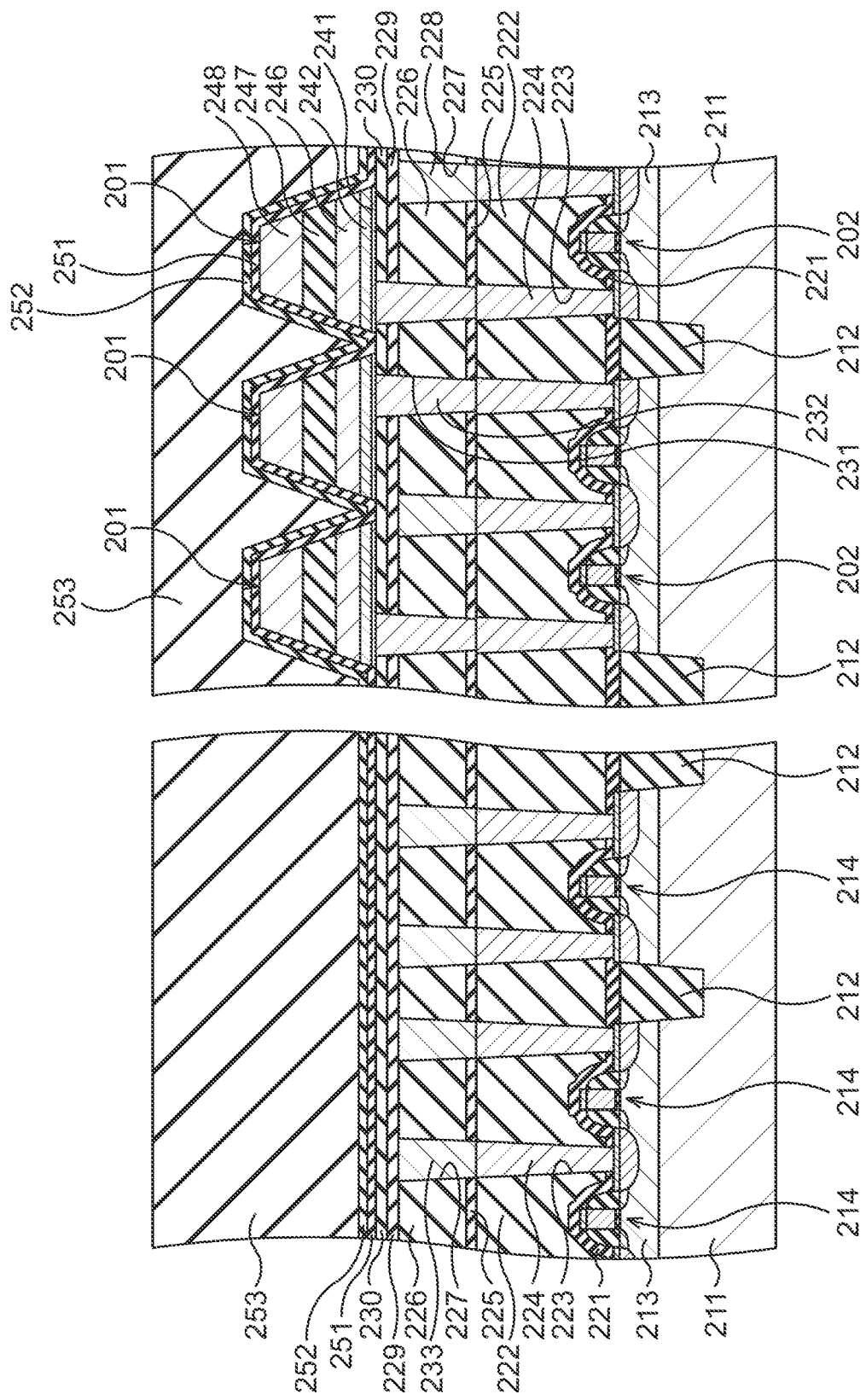

Then, as illustrated in FIG. 5E, the protective film 251 covering the ferroelectric capacitors 201 is formed over the buffer film 230. An aluminum oxide film having a thickness of 5 nm to 20 nm, for example, is formed as the protective film 251 by a sputtering method. Thereafter, annealing is performed at a temperature of 500° C. to 650° C. in an oxygen atmosphere so as to recover damage caused when the protective film 251 is formed. Subsequently, the protective film 252 is formed over the protective film 251. An aluminum oxide film having a thickness of 30 nm to 100 nm, for example, is formed as the protective film 252 by a metal organic chemical vapor deposition (ALD) method. Then, the interlayer insulating film 253 is formed over the protective film 252. A silicon oxide film having thickness of about 1400 nm, for example, is formed as the interlayer insulating film 253 by a plasma CVD method using a mixed gas of TEOS, oxygen and helium. An inorganic film having insulation performance or others may be formed as the interlayer insulating film 253, for example.

Thereafter, the surface of the interlayer insulating film 253 is flattened by a CMP method, for example. Subsequently, a heat treatment is performed in a plasma atmosphere generated using $N_2O$ gas, $N_2$ gas, or others. As a result of the heat treatment, moistures inside the interlayer insulating film 253 and others are removed and qualities of the interlayer insulating film 253 and others are changed, resulting in that moisture does not easily enter the interlayer insulating film 253. After flattening the interlayer insulating film 253 by CMP, a silicon oxide film having a thickness of about 250 nm, for example, may be formed by a plasma CVD method using a gas containing TEOS. Even if a recessed portion is formed in the surface of the interlayer insulating film 253 between the ferroelectric capacitors 201 due to CMP, the recessed portion is filled with the silicon oxide film and the flat surface can be obtained. Also in the case when the silicon oxide film is formed, the heat treatment is preferably performed in the plasma atmosphere generated using $N_2O$ gas, $N_2$ gas, or others thereafter.

Figure 5F:
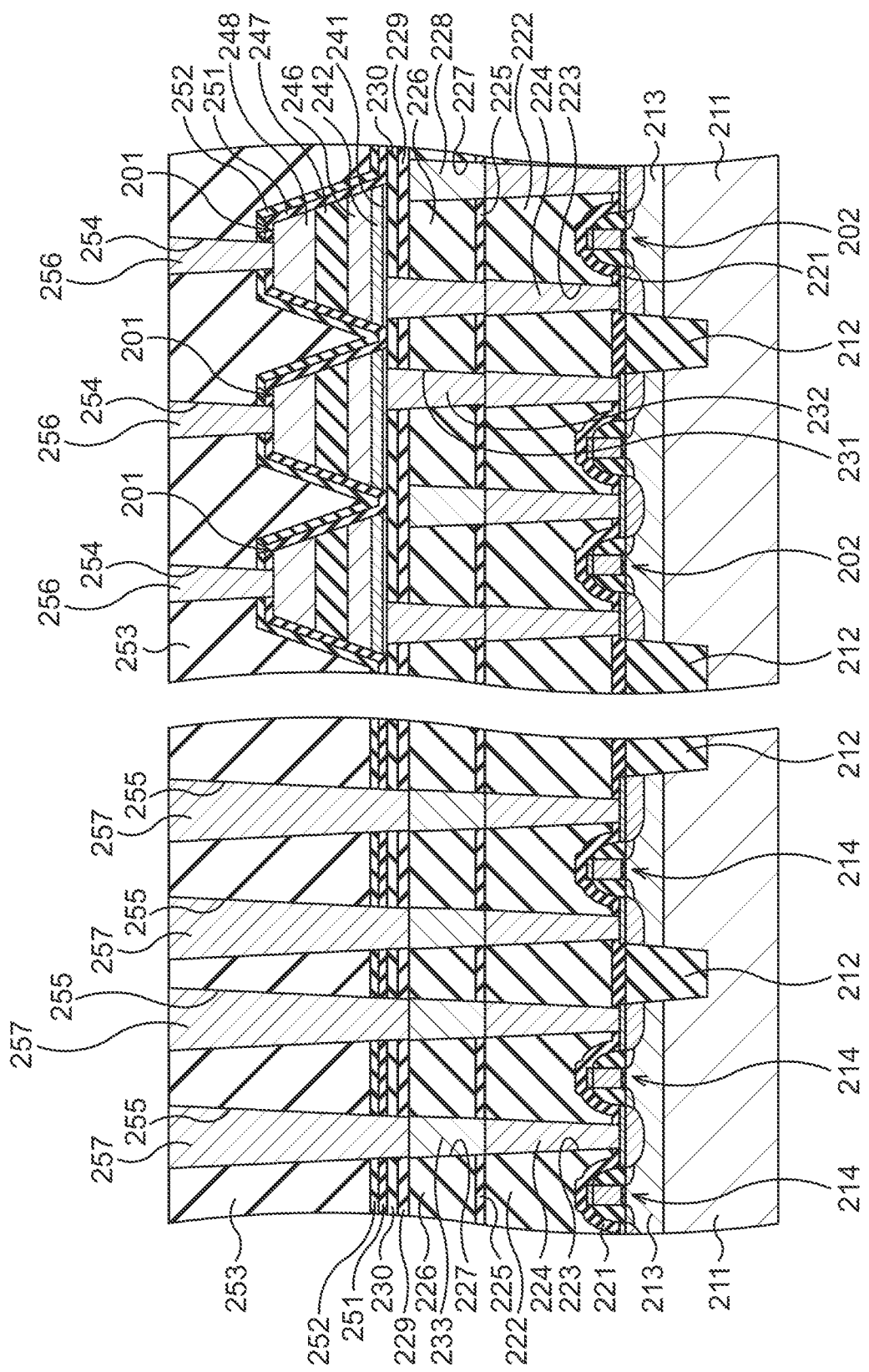
Figure 6B:
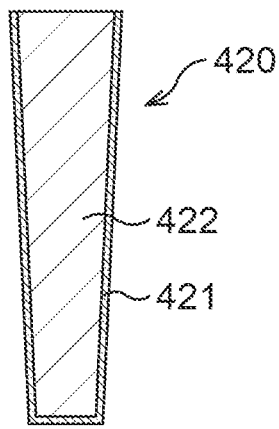
FIG. 6B is a cross-sectional view illustrating another example of a structure of a conductive stack.

Then, as illustrated in FIG. 5F, the contact hole 254 exposing the top electrode 248 is formed in the interlayer insulating film 253, the protective film 252, and the protective film 251. In the formation of the contact holes 254, the interlayer insulating film 253, the protective film 252, and the protective film 251 are patterned by a photolithography method, for example. When the hard mask remains over the top electrodes 248, the contact hole 254 is formed so as to pass through also the hard mask, for example. The contact hole 255 exposing the conductive plug 233 is formed in the interlayer insulating film 253, the protective film 252, the protective film 251, the buffer film 230, and the oxidation preventing film 229 in the peripheral circuit region 302. In the formation of the contact hole 255, the interlayer insulating film 253, the protective film 252, the protective film 251, the buffer film 230, and the oxidation preventing film 229 are patterned by a photolithography method, for example. Thereafter, the conductive plug 256 is formed in the contact hole 254 and the conductive plug 257 is formed in the contact hole 255. As the conductive plug 256 and the conductive plug 257, for example, one having a stacked structure similar to that of a conductive stack 420 illustrated in FIG. 6B may be formed. More specifically, for example, a titanium nitride film 421 may be formed as an adhesive film (glue film) by a CVD method in the contact hole 254 and the contact hole 255, and a tungsten film 422 may be formed over the titanium nitride film 421 by a CVD method. Then, the tungsten film 422 and the titanium nitride film 421 may be polished by a CMP method until the upper surface of the interlayer insulating film 253 is exposed. In place of the titanium nitride film 421, a stack of a titanium film and a titanium nitride film may be formed.

Figure 5G:
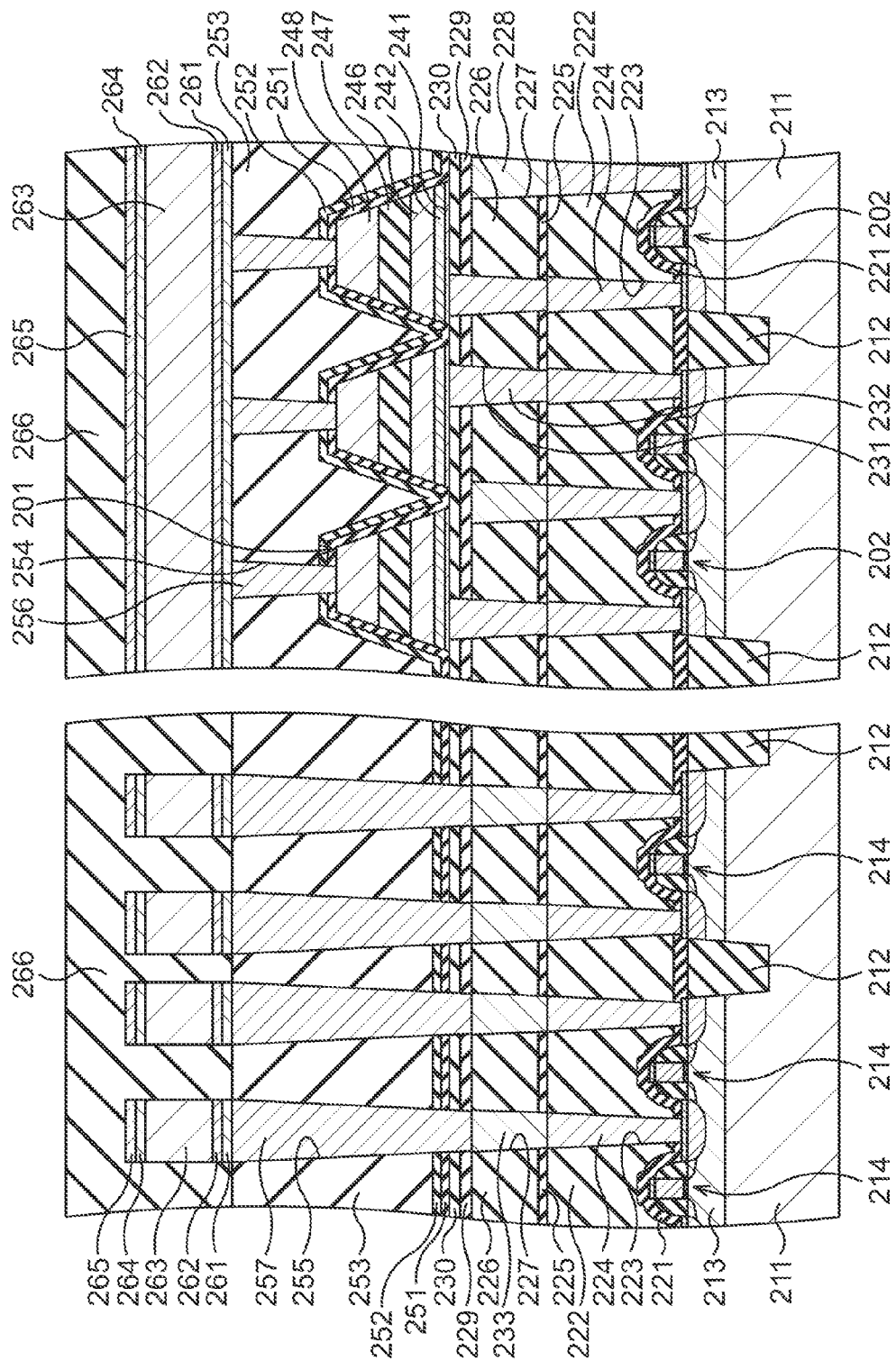

Thereafter, as illustrated in FIG. 5G, the stacked structure conductive film is formed over the interlayer insulating film 253, the conductive plug 256, and the conductive plug 257. In the formation of the stacked structure conductive film, for example, the titanium film 261 having a thickness of 60 nm, the titanium film 262 having a thickness of 30 nm, the AlCu alloy film 263 having a thickness of 360 nm, the titanium film 264 having a thickness of 5 nm, and the titanium nitride film 265 having a thickness of 70 nm may be formed sequentially by a sputtering method. Subsequently, the stacked structure conductive film may be patterned by a photolithography method, and thereby the wiring including the stacked structure conductive film is formed in the memory cell region 301 and the peripheral circuit region 302. At this time, the stacked structure conductive film is made into the shape of the plate line 205 in the memory cell region 301. Then the interlayer insulating film 266 covering the wiring is formed over the interlayer insulating film 253. Then, an upper wiring, an interlayer insulating film, and others are formed, and the semiconductor device is completed.

Figure 7:
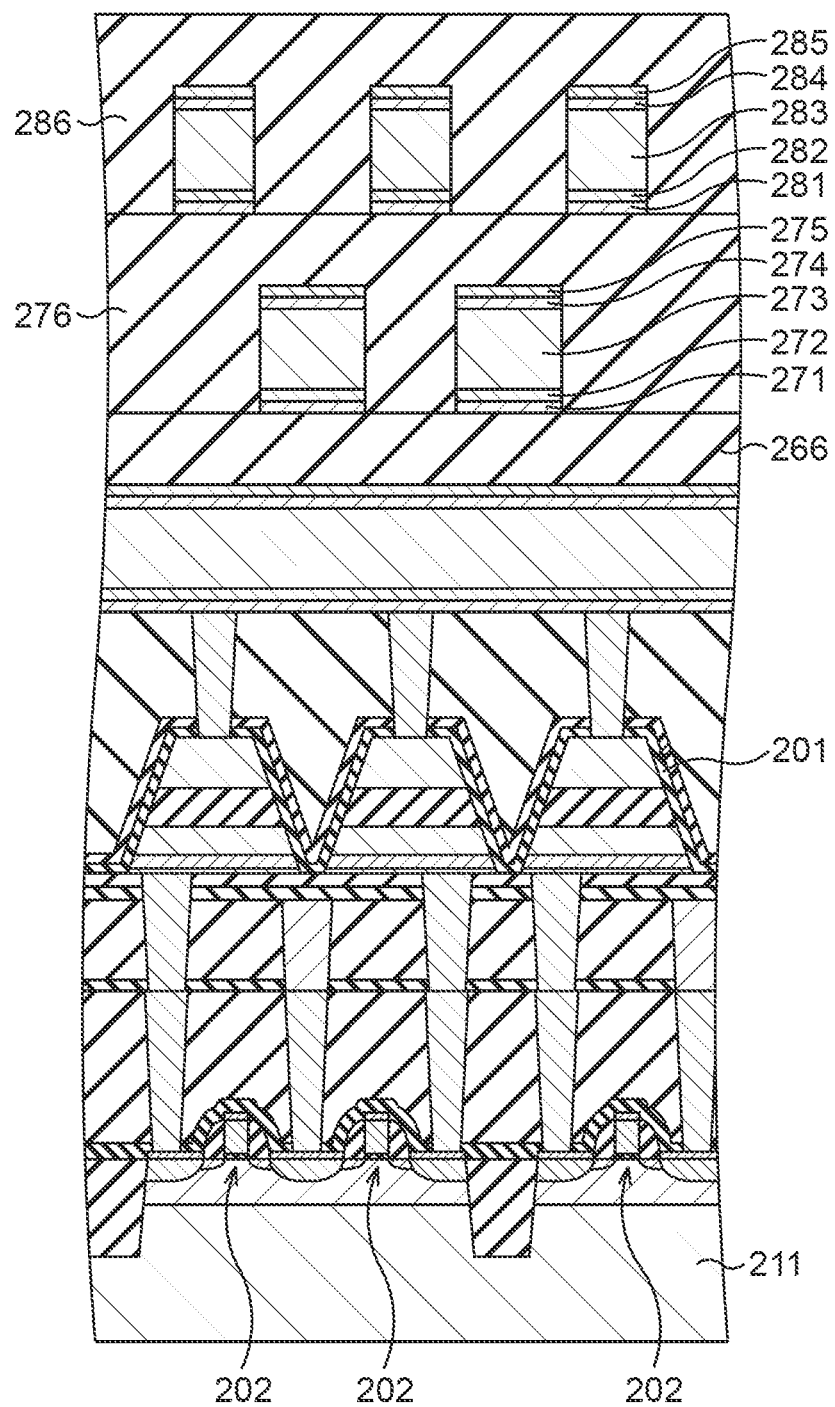
FIG. 7 is a cross-sectional view illustrating another example of a structure of a conductive stack.

The number of wiring layers included in the semiconductor device is not limited to particular ones. For example, as illustrated in FIG. 7, three wiring layers may be formed above the top electrodes 248. That is, in this example, the plate line 205 including the titanium film 261, the titanium nitride film 262, the AlCu alloy film 263, the titanium film 264, and the titanium nitride film 265 is included in one of the wiring layers. A second wiring including a titanium film 271, a titanium nitride film 272, an AlCu alloy film 273, a titanium film 274, and a titanium nitride film 275 is formed over the interlayer insulating film 266, and an interlayer insulating film 276 covering the second wiring is formed over the interlayer insulating film 266. The second wiring is included in another one of the wiring layers. A third wiring including, a titanium film 281, a titanium nitride film 282, an AlCu alloy film 283, a titanium film 284, and a titanium nitride film 285 is formed over the interlayer insulating film 276, and an interlayer insulating film 286 covering the third wiring is formed over the interlayer insulating film 276. The third wiring is included in the other one of the wiring layers. For example, the second wiring is connected in parallel to the word line 103, namely to the gate electrode 402 of the switching element 202, and the third wiring is connected in parallel to the plate line 205, namely to the AlCu alloy film 273 and the like. As above, when there is a plurality of wiring layers above the top electrodes 248, the plate line 205 is preferably included in one disposed at the lowermost position of the wiring layers. The second wiring and the third wiring are sometimes called backing.

Figure 8:
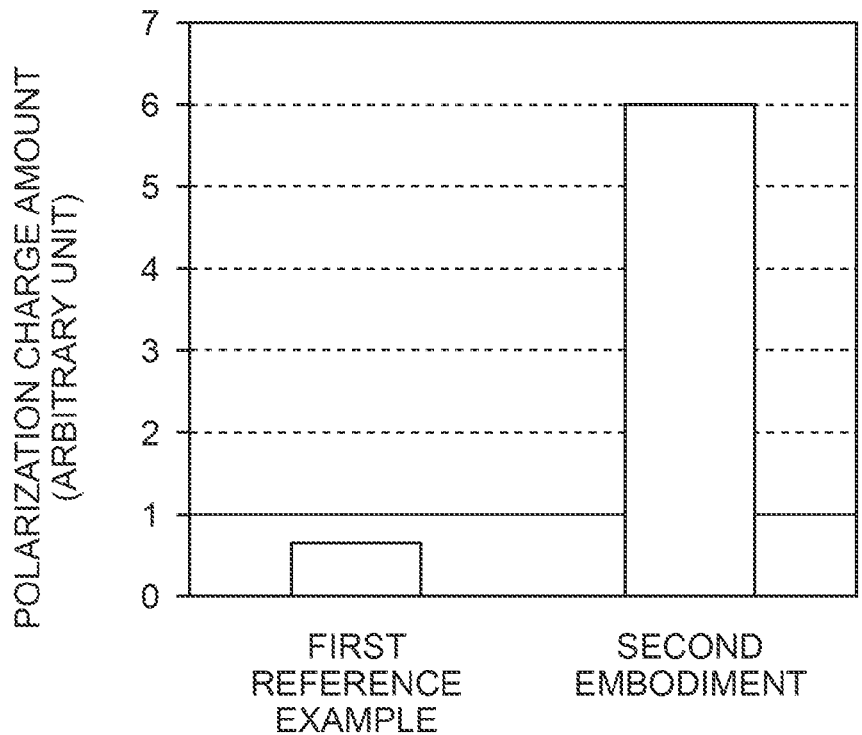
FIG. 8 is a view illustrating a measurement result of a polarization charge amount of the example illustrated in FIG. 7.

As a result that the planar shape of the ferroelectric capacitor 201 in the example illustrated in FIG. 7 was set to a square 0.7 µm on a side and a polarization charge amount was measured, a polarization charge amount sufficient for operating the ferroelectric memory could be obtained as illustrated in FIG. 8. In the example illustrated in FIG. 7, the plate line 205 covers the ferroelectric capacitors 201 sharing the word lines 203, the ferroelectric capacitors 201 sharing the bit lines 204, and the regions between these ferroelectric capacitors 201 from above, whereas in a first comparative example, a plate line is positioned immediately above ferroelectric capacitors sharing word lines, and in a direction in which the word lines are arranged, no plate line exists above regions between the word lines. That is, the plate line 205 is formed so as to correspond to the plural word lines 203 in the example illustrated in FIG. 7, whereas a form such that this plate line 205 is divided every word line 203 is made in a first reference example.

Next, results of experiments will be explained on the relationship between the shape of the plate line and the polarization charge amount performed by the inventor of the present application.

In the first experiment, experiments of four types of plate lines illustrated in FIG. 9A to FIG. 9D were performed. In Example 11, Example 12, Example 13, and Example 14 illustrated in FIG. 9A to FIG. 9D, the planar shape of each top electrode 701 was a square 1.5 µm on a side. A plate line 702 whose planar shape was a square 1 µm on a side was disposed to be inside of each of the top electrodes 701 in planar view in Example 11 illustrated in FIG. 9A. A plate line 702 whose planer shape matched that of the top electrode 701 was disposed to match the outline of each of the top electrodes 701 in Example 12 illustrated in FIG. 9B. A plate line 702 was disposed in such a manner that the outline of the plate line 702 was outside of each of the outline of the top electrode 701 in Example 13 illustrated in FIG. 9C. A plate line 702 was disposed to cover the top electrodes 701 and regions between them in Example 14 illustrated in FIG. 9D. Measurement results of the polarization charge amount in the four examples are illustrated in FIG. 10.

Figure 10:
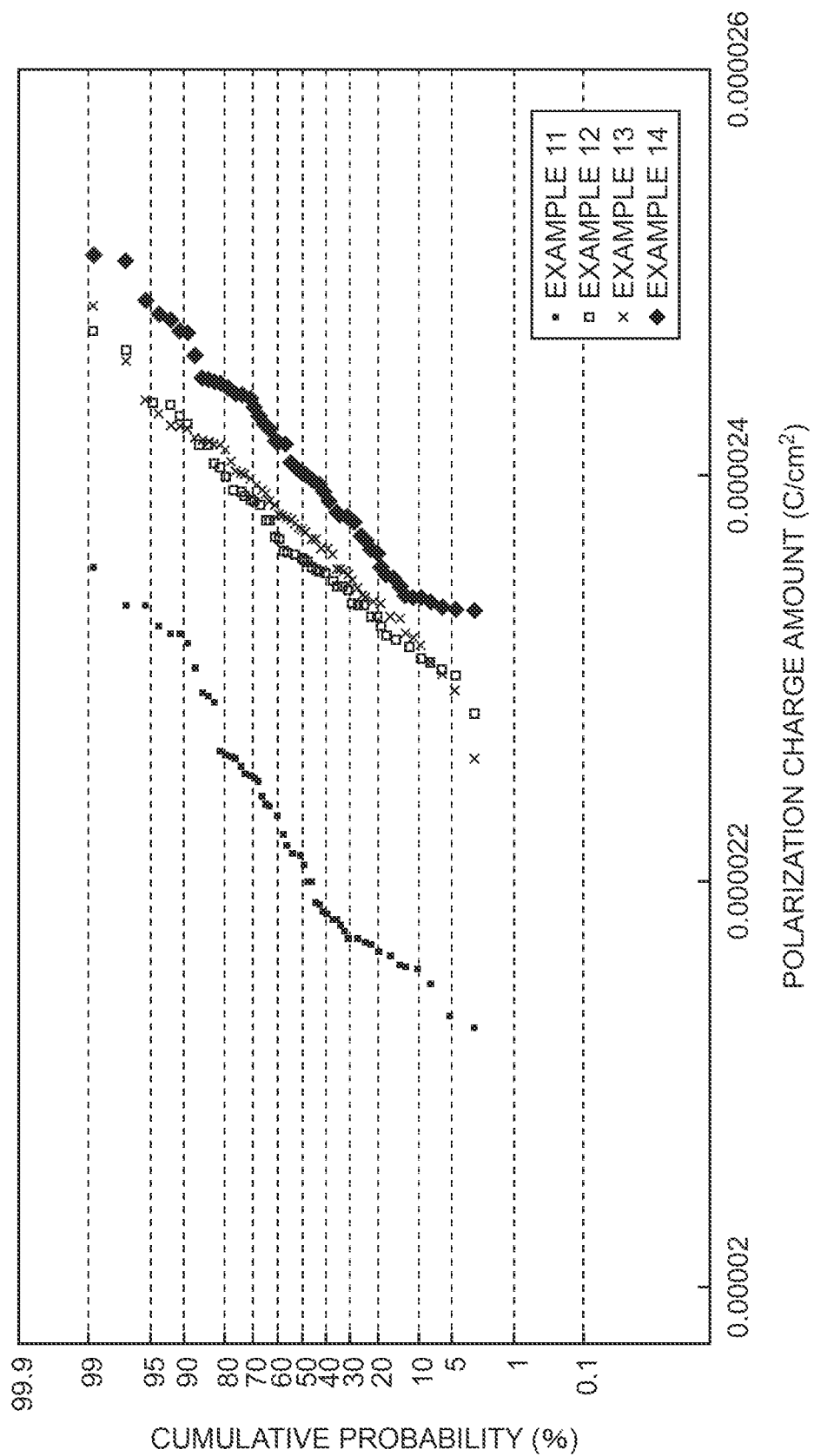
FIG. 10 is a view illustrating results of a first experiment.

As illustrated in FIG. 10, a quite excellent polarization charge amount was able to be obtained in Example 14. Further, there was recognized a tendency in which the larger the area of the plate line is, the higher the polarization charge amount is.

Figure 9A:
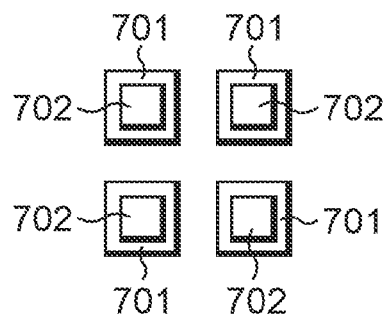
FIG. 9A to FIG. 9D are views each illustrating a relationship between a top electrode and a plate line.
Figure 9B:
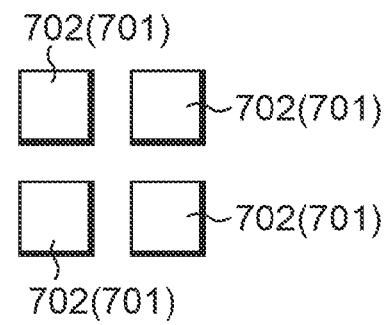
Figure 9C:
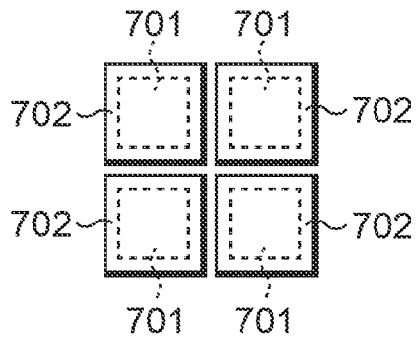

In the second experiment, the plate lines 702 of Example 13 illustrated in FIG. 9C were used, and a metal film was formed in one of wiring layers above the plate lines 702 so as to cover the top electrodes 701 and the regions between them. The metal film was formed in the fourth wiring layer above the plate lines 702 in Example 22. The metal film was formed in the third wiring layer above the plate lines 702 in Example 23. The metal film was formed in the second wiring layer above the plate lines 702 in Example 24. The metal film was formed in the first wiring layer above the plate lines 702 in Example 25. Only the plate lines 702 were formed and the metal film was not formed above the plate lines 702 in Example 21. Measurement results of the polarization charge amount in the five examples are illustrated in FIG. 11.

Figure 11:
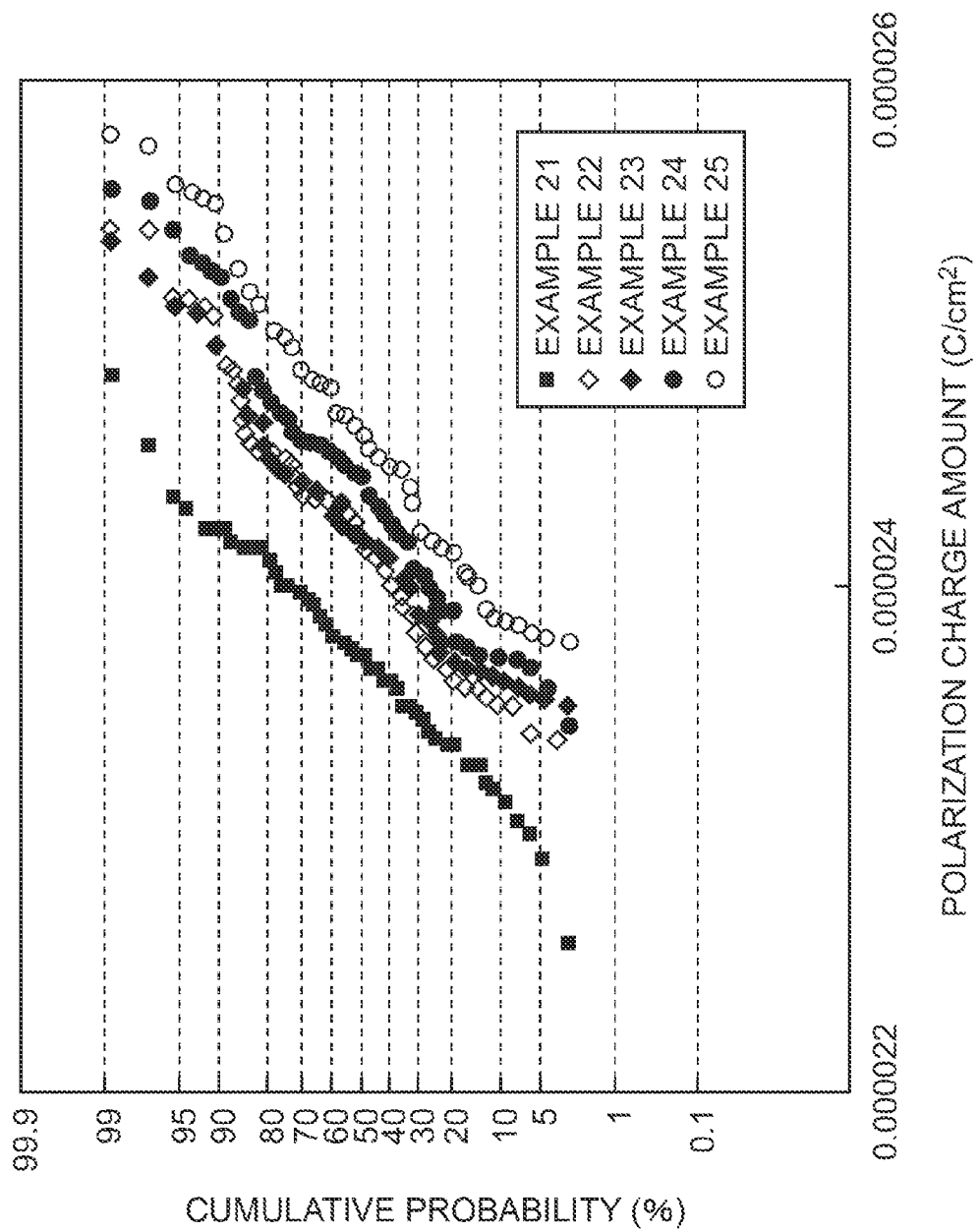
FIG. 11 is a view illustrating results of a second experiment.

As illustrated in FIG. 11, the polarization charge amount in Example 21, in which the plate lines 702 were formed but the metal film was not formed, was the lowest, and there was recognized a tendency in which as the metal film is formed at a position closer to the plate lines 702, the polarization charge amount is higher in the other four examples.

Figure 9D:
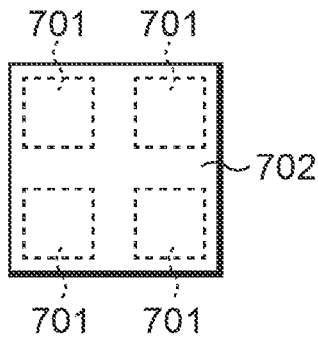

In the third experiment, the plate line 702 of Example 14 illustrated in FIG. 9D was used, and a metal film was formed in one of wiring layers above the plate line 702 so as to cover the top electrodes 701 and the regions between them. The metal film was formed in the fourth wiring layer above the plate line 702 in Example 32. The metal film was formed in the third wiring layer above the plate line 702 in Example 33. The metal film was formed in the second wiring layer above the plate line 702 in Example 34. The metal film was formed in the first wiring layer above the plate line 702 in Example 35. The metal film was formed in four wiring layers from the first wiring layer to the fourth wiring layer above the plate line 702 in Example 36. Only the plate line 702 was formed and the metal film was not formed above the plate line 702 in Example 31. Measurement results of the polarization charge amount in the six examples are illustrated in FIG. 12.

Figure 12:
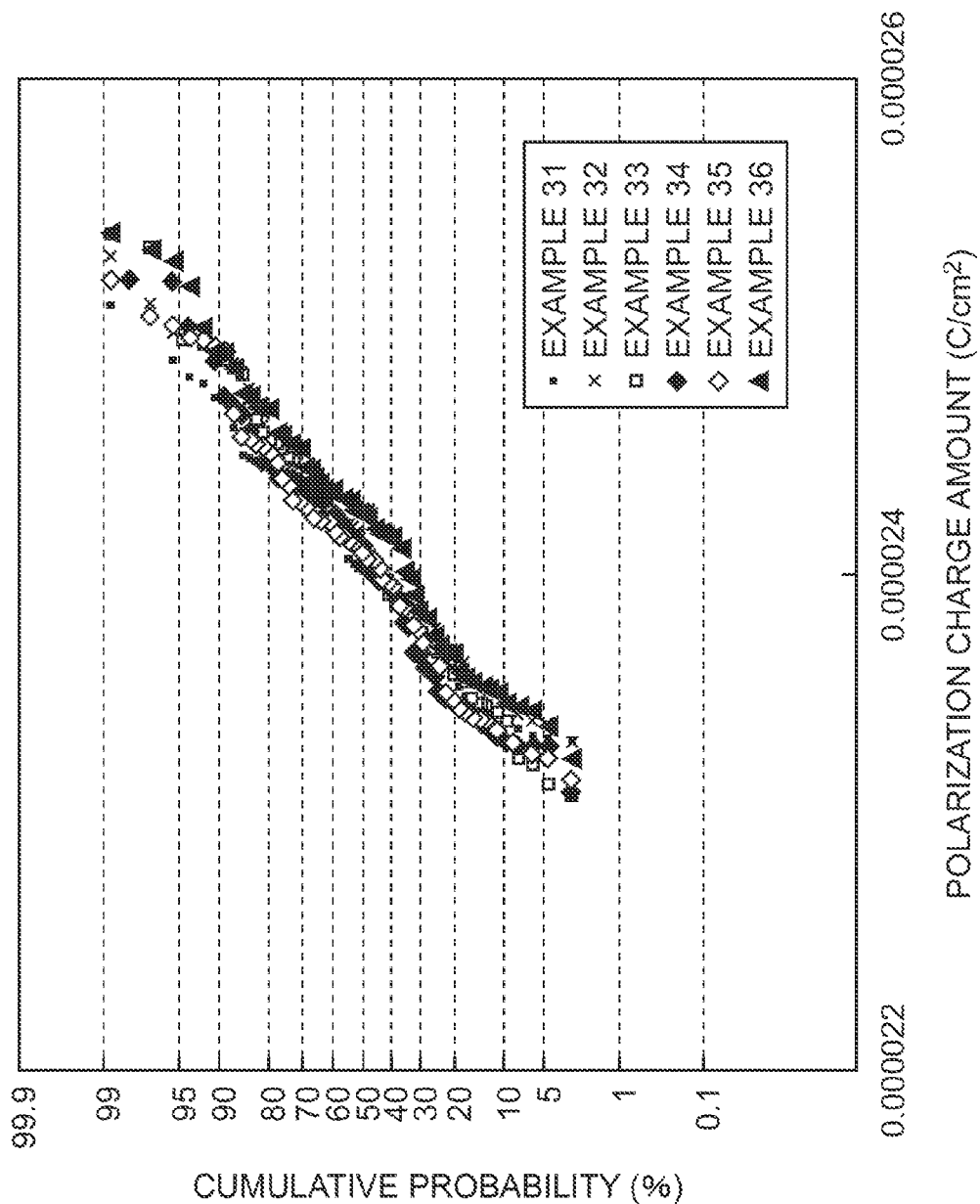
FIG. 12 is a view illustrating results of a third experiment.

As illustrated in FIG. 12, it was recognized that there are no significant differences among Example 31 to Example 36. This means that, as long as the plate line 702 in Example 14 is formed in the lowermost wiring layer, a quite excellent polarization charge amount can be obtained regardless of the shape of wirings above it.

Figure 13:
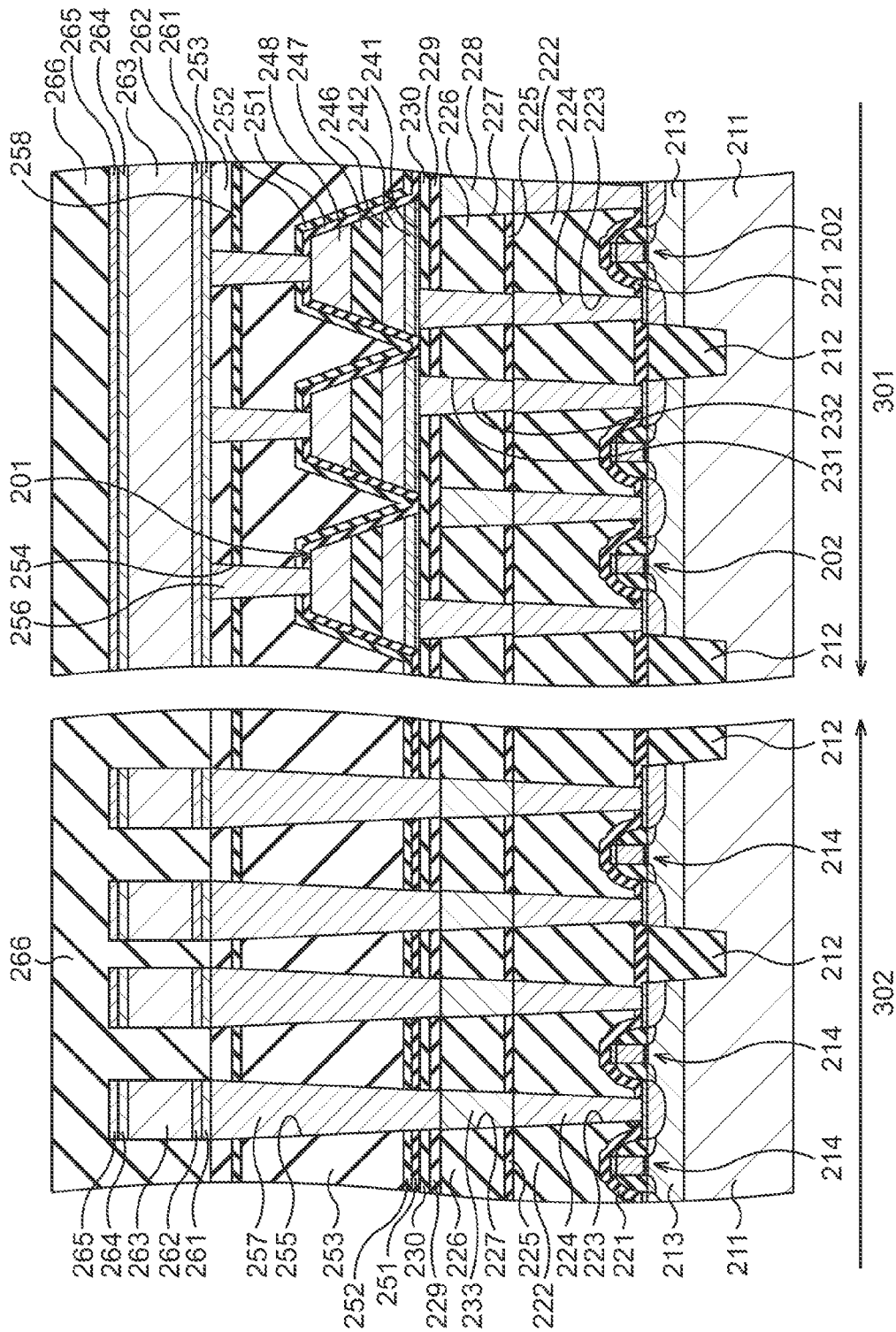
FIG. 13 is a cross-sectional view illustrating a structure of a modified example of the second embodiment.

A protective film 258 such as an aluminum oxide film may be formed in the interlayer insulating film 253 such as a silicon oxide film, which exists between the ferroelectric capacitors 201 and the wiring constituting the plate line 205, as illustrated in FIG. 13. The protective film 258 makes it possible to further suppress the in-process degradation of the ferroelectric capacitors 201.

Dummy cells may be included in the memory cell region 301, and in this case, the dummy cells are preferably covered with the plate line 205.

The materials of the top electrode are not limited to the ones described above, and for example, strontium ruthenium oxide (SRO), iridium, iridium oxide, and platinum may be used. The materials of the plate line are also not limited to the ones described above, and for example, aluminum, copper, tungsten, titanium, titanium nitride, and others may be used. As the material of the plate line, one with a catalytic activity that activates a substance that reduces the capacitor insulating film lower than that of the material of the top electrode is preferable. The materials of the conductive plug are also not limited to the ones described above, and for example, tungsten, titanium, and others may be used. A high melting point metal is preferable as the material of the conductive plug. The materials of the ferroelectric film (capacitor insulating film) are also not limited to the ones described above, and for example, PZT and one in which one or more selected from the group consisting of calcium (Ca), strontium (Sr), lanthanum (La), niobium (Nb), tantalum (Ta), iridium (Ir), and tungsten (W) are added to PZT may be used. A bismuth (Bi) layer structure compound such as $SrBi_2Ta_2O_9$, $SrBi_4Ti_4O_{15}$, $(Bi,La)_4Ti_3O_{12}$, or $BiFeO_3$ may be used for the material of the ferroelectric film (capacitor insulating film).

Such a semiconductor device provided with the ferroelectric memory may be used for, for example, a measuring instrument, an industrial machine, and a hearing aid. As for medical instruments such as a hearing aid, high-speed writing becomes possible and it becomes possible to suppress a risk of date loss caused by instantaneous voltage drop and power failure, when a device with an EEPROM is replaced with a device with the ferroelectric memory. Power consumption for wiring can be decreased by about 92% as compared to the EEPROM, so that when the semiconductor device is incorporated in a device with a battery, the battery can be used for along time.

Such a semiconductor device provided with the ferroelectric memory can also be used in an integrated circuit (IC) tag to be attached to a sample container on which gamma irradiation sterilization is performed and others. For example, a bar code is sometimes used for management of containers such as a sample container on which gamma irradiation sterilization is performed. These containers are sometimes stored in a cool environment or a freezing environment, and on this occasion, water drops, frost, or the like is often attached to them. When water drops, frost, or the like is attached to them, accurate reading of a bar code sometimes becomes difficult. Thus, management using an integrated circuit (IC) tag enabling non-contact reading in place of using a bar code is considered to that the effect of water drops, frost, or the like can be eliminated. However, in an IC tag in which an IC chip having an EEPROM mounted thereon is contained, data of the IC chip are lost by gamma irradiation. In contrast to this, the semiconductor device provided with the ferroelectric memory is resistant to gamma irradiation.

According to the above-described semiconductor device, an appropriate plate line is provided, so that a sufficient polarization charge amount can be obtained even when the ferroelectric capacitor is miniaturized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device, comprising:
a plurality of ferroelectric capacitors, each of the ferroelectric capacitors including a bottom electrode, a capacitor insulating film, and a top electrode;

a plurality of switching elements, each of the switching elements being connected to one of the ferroelectric capacitors, respectively;

a plurality of word lines, each of the word lines switching on and off two or more of the switching elements;

a plurality of bit lines, each of the bit lines being connected to two or more of the switching elements; and a plate line that is connected to ferroelectric capacitors selected from the plurality of ferroelectric capacitors and covers the selected ferroelectric capacitors and regions between the selected ferroelectric capacitors from above the top electrodes, wherein a catalytic activity, of a material of the plate line, that activates a substance that reduces the capacitor insulating film is lower than a catalytic activity, of a material of the top electrode, that activates a substance that reduces the capacitor insulating film.

2. The semiconductor device according to claim 1, wherein ferroelectric capacitors connected to two or more of the switching elements that are switched on and off by the individual word lines are included in the selected ferroelectric capacitors, and ferroelectric capacitors connected to two or more of the switching elements connected to the individual bit lines are included in the selected ferroelectric capacitors.

3. The semiconductor device according to claim 1, wherein the material of the plate line is aluminum, copper, tungsten, titanium, or titanium nitride, or any combination thereof.

4. The semiconductor device according to claim 1, wherein the material of the top electrode is iridium, platinum, or strontium, or any combination thereof.

5. The semiconductor device according to claim 1, further comprising a plurality of wiring layers above the top electrodes, wherein the plate line is included in a wiring layer disposed at the lowermost position among the plurality of wiring layers.

6. The semiconductor device according to claim 1, further comprising an interlayer insulating film between the top electrodes and the plate line, wherein the top electrodes and the plate line are electrically connected via openings in the interlayer insulating film.

7. The semiconductor device according to claim 1, wherein the bit lines are formed below the ferroelectric capacitors.

8. The semiconductor device according to claim 1, further comprising a protective film that directly covers the ferroelectric capacitors.

* * * * *